(12) United States Patent
Mori et al.

(10) Patent No.: US 7,872,536 B2
(45) Date of Patent: Jan. 18, 2011

(54) VARIANCE CORRECTION METHOD, PLL CIRCUIT AND SEMICONDUCTOR INTEGRATED CIRCUIT

(75) Inventors: Toshihiko Mori, Kawasaki (JP); Masafumi Kondo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/499,849

(22) Filed: Jul. 9, 2009

(65) Prior Publication Data

US 2009/0315628 A1    Dec. 24, 2009

Related U.S. Application Data

(63) Continuation of application No. PCT/JP2007/050097, filed on Jan. 9, 2007.

(51) Int. Cl.
| | |
|---|---|
| H03L 7/06 | (2006.01) |
| H03L 7/085 | (2006.01) |
| H03L 7/087 | (2006.01) |
| H03L 7/093 | (2006.01) |
| H03L 7/099 | (2006.01) |
| H03L 7/18 | (2006.01) |

(52) U.S. Cl. .............. 331/17; 331/8; 331/11; 331/16; 331/25

(58) Field of Classification Search ........ 331/8, 331/10–12, 16–18, 25; 327/156–159; 332/127; 360/51; 375/376; 455/260
See application file for complete search history.

(56) References Cited

U.S. PATENT DOCUMENTS

| | | | |
|---|---|---|---|
| 7,352,249 B2* | 4/2008 | Balboni et al. | ........ 331/16 |
| 2003/0042985 A1 | 3/2003 | Shibahara et al. | |
| 2006/0012442 A1 | 1/2006 | Shinbo et al. | |

FOREIGN PATENT DOCUMENTS

| | | |
|---|---|---|
| JP | 2001-016102 A | 1/2001 |
| JP | 2003-078410 A | 3/2003 |
| JP | 2006-033108 A | 2/2006 |

* cited by examiner

*Primary Examiner* — David Mis
(74) *Attorney, Agent, or Firm* — Arent Fox LLP

(57) ABSTRACT

A variance correction method includes generating a reference current depending on a resistance within a lowpass filter and outputting the reference current to a voltage controlled oscillator, and correcting characteristics of the lowpass filter and a gain of the voltage controlled oscillator based on an output clock of the voltage controlled oscillator.

14 Claims, 24 Drawing Sheets

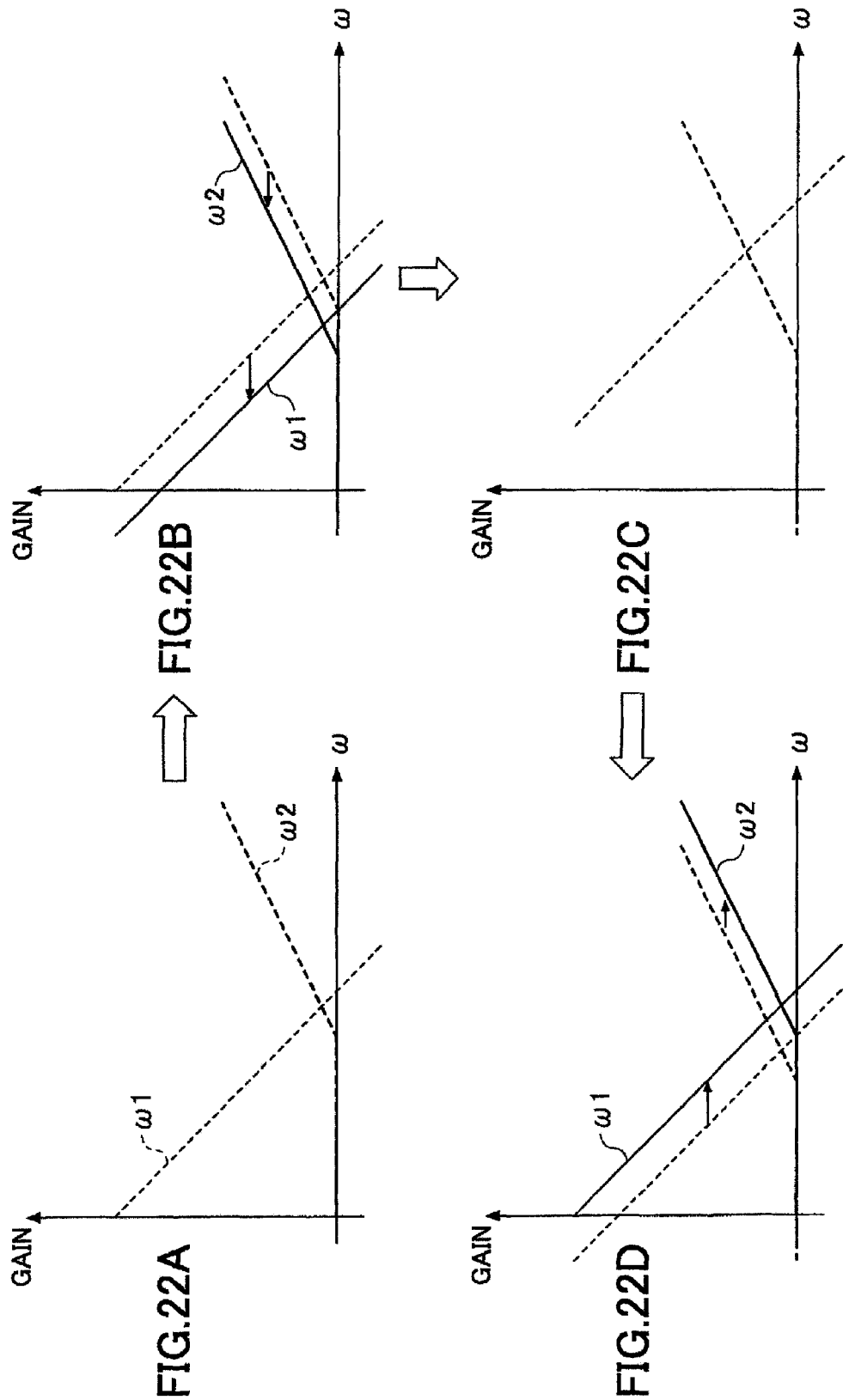

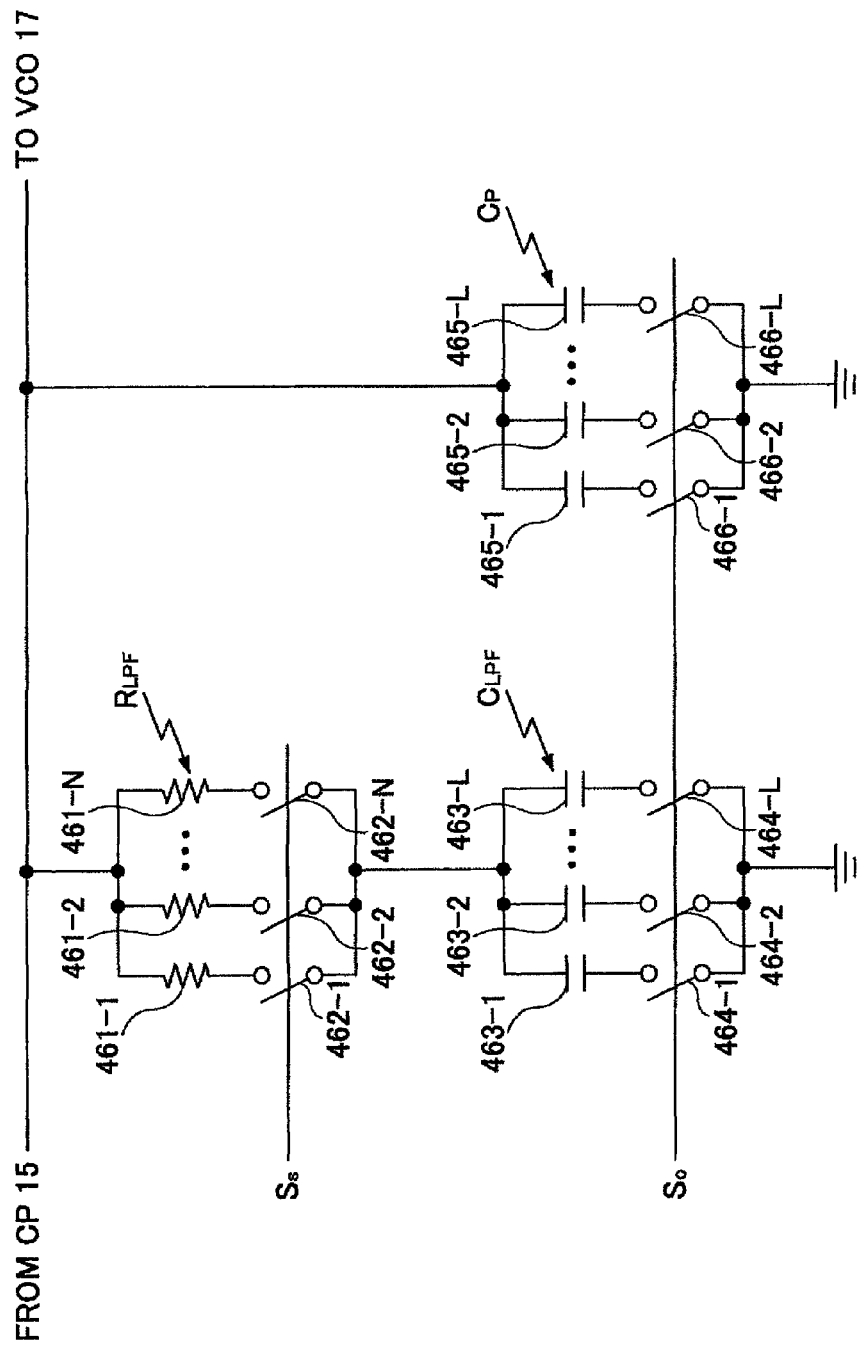

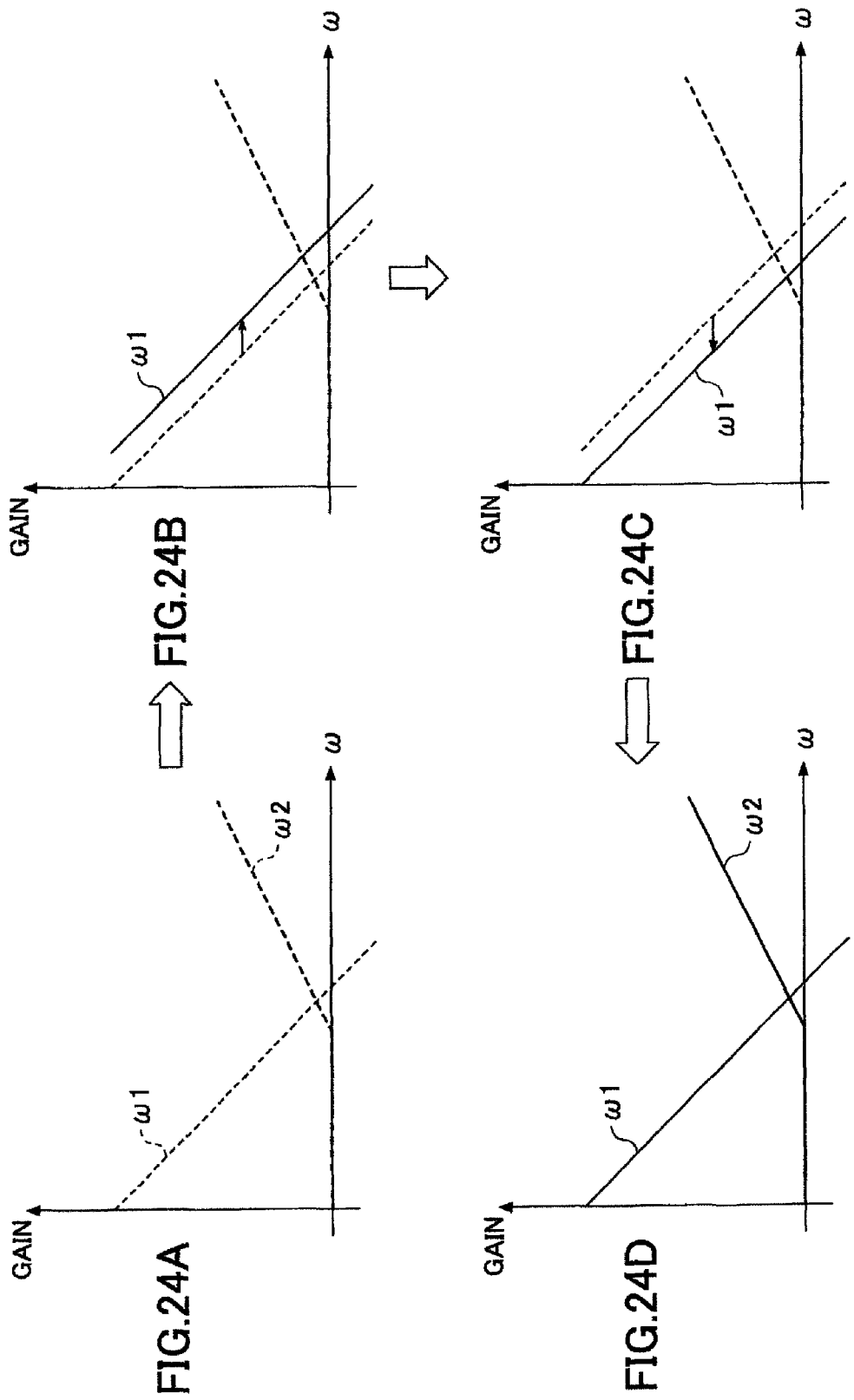

VARIANCE CORRECTION METHOD, PLL CIRCUIT AND SEMICONDUCTOR INTEGRATED CIRCUIT

CROSS-REFERENCE TO RELATED APPLICATIONS

This application is a continuation application filed under 35 U.S.C. 111(a) claiming the benefit under 35 U.S.C. 120 and 365(c) of a PCT International Application No. PCT/JP2007/050097 filed on Jan. 9, 2007, in the Japanese Patent Office, the disclosure of which is hereby incorporated by reference.

FIELD

The present invention generally relates to variance correction methods, Phase Locked Loop (PLL) circuits, and semiconductor integrated circuits, and more particularly to a variance correction method for correcting a variance in characteristics of the PLL, a PLL circuit that employs such a variance correction method, and a semiconductor integrated circuit having such a PLL circuit.

BACKGROUND

PLL circuits are used in various fields, and various semiconductor integrated circuits having the PLL circuit are known. Characteristics of the PLL include a lock-up time, a jitter characteristic, a phase noise characteristic and the like, and the PLL circuit is designed so that the PLL performs a stable operation.

FIG. 1 is a diagram illustrating an example of a conventional PLL circuit. A PLL circuit 1 includes a Phase Frequency Detector (PFD) 2, a Charge Pump (CP) 3, a Low-Pass Filter (LPF) 4, a Voltage Controlled Oscillator (VCO) 5, and a frequency divider (DIV) 6 which are coupled as illustrated in FIG. 1.

However, when the PLL circuit 1 is fabricated by a semiconductor process such as a Complementary Metal Oxide Semiconductor (CMOS) process, a variance is generated in the characteristics of the elements forming each part of the PLL circuit 1 due to inconsistencies introduced during the fabrication process. For this reason, parameters including an output current $I_{CP}$ of the CP 3, a resistance $R_{LPF}$ of a resistor $R_{LPF}$ within the LPF 4, capacitances $C_{LPF}$ and $C_P$ of capacitors $C_{LPF}$ and $C_P$ within the LPF 4, and a VCO gain $K_{VCO}$ of the VCO 5 become larger or smaller than the respective designed values. As a result, a variance is generated in the characteristics of the PLL among the individual PLL circuits 1.

FIGS. 2 and 3 are diagrams illustrating a state where the variance is generated in the characteristics of the PLL. FIG. 2 illustrates a gain versus frequency characteristic of the PLL circuit 1, and FIG. 3 illustrates a phase delay versus frequency characteristic of the PLL circuit 1. In FIGS. 2 and 3, a solid line indicates the characteristic for a case where all of the parameters have the designed value, and a dotted line indicates the characteristic for a case where the variance is generated in at least one of the parameters and the at least one of the parameters is larger or smaller than the corresponding designed value. In FIG. 2, the ordinate and the abscissa are indicated in arbitrary logarithmic units.

The frequency at which the gain becomes 0 db and the phase margin greatly affect the stability of the PLL, and may be determined from the following three parameters $\omega 1$, $\omega 2$ and $\omega 3$. The phase margin corresponds to a difference of the phase delay at the frequency which makes the gain 0 dB from $-180°$. In the following formulas, $N_{div}$ denotes a multiplication factor of the frequency divider 6, and $C_{all}$ denotes a capacitance represented by $C_{all} = C_{LPF} + C_P$.

$$\omega 1 = \{K_{VCO} \cdot I_{CP}/2\pi \cdot N_{div} \cdot C_{all}\}^{1/2}$$

$$\omega 2 = 1/(R_{LPF} \cdot C_{LPF})$$

$$\omega 3 = 1/(R_{LPF} \cdot C_P)$$

FIGS. 4 and 5 are diagrams for explaining the three parameters $\omega 1$, $\omega 2$ and $\omega 3$. A solid line in FIG. 4 indicates a gain versus frequency characteristic of the PLL circuit 1, and a solid line in FIG. 5 indicates a phase delay versus frequency characteristic of the PLL circuit 1. In addition, in FIGS. 4 and 5, dotted lines indicate the parameters $\omega 1$, $\omega 2$ and $\omega 3$ at the frequency which makes the gain 0 dB. In FIG. 4, the ordinate and the abscissa are indicated in arbitrary logarithmic units.

For example, a Japanese Laid-Open Patent Publication No. 2006-33108 proposes a semiconductor integrated circuit in which a large variance in the characteristics of the PLL will not be generated even if the parameters vary. This proposed semiconductor integrated circuit includes a control part, a charge pump, and a LPF. The control part outputs an amount of data depending on a product of a resistance of a resistor part and a capacitance of a capacitor part. The charge pump has a structure such that an output current value thereof depends on a resistance of a portion made up of resistors that are coupled in parallel, and the resistance of the part made up of the resistors is reduced by increasing the number of resistors coupled in parallel depending on the amount of data. The LPF has a structure such that the resistance of a part made up of resistors that are coupled in parallel is reduced by increasing the number of resistors coupled in parallel depending on the amount of data. In other words, the parameter $\omega 1$ reduces the effects of the variance in the resistances of the resistors and the capacitances of the capacitors within the charge pump, and the parameters $\omega 2$ and $\omega 3$ reduce the effects of the variance in the resistances of the resistors and the capacitances of the capacitors within the LPF.

Accordingly, in the proposed semiconductor integrated circuit described above, the parameters $I_{CP}$ and $C_{all}$ which determine the parameter $\omega 1$, the parameters $R_{LPF}$ and $C_{LPF}$ which determine the parameter $\omega 2$, and the parameters $R_{LPF}$ and $C_P$ which determine the parameter $\omega 3$ in the above described formulas of the three parameters $\omega 1$, $\omega 2$ and $\omega 3$ are less affected by the inconsistencies introduced during the fabrication process. Hence, the variance in the characteristics of the PLL caused by the inconsistencies introduced during the fabrication process can be suppressed to a certain extent by the proposed semiconductor integrated circuit.

In the proposed semiconductor integrated circuit, if the parameter $R_{LPF}$ has a resistance that is 3/2 times that of the corresponding designed value, for example, the parameter $\omega 2$ can be corrected to the corresponding designed value by correcting the parameter $C_{LPF}$ to a capacitance that is 2/3 times that of the corresponding designed value. However, the variance in the capacitance also affects the parameter $\omega 1$, and thus, there is a limit to correcting the variance in the characteristics of the PLL by such a variance correction method. For example, in an extremely large-scale CMOS process, the variance is also generated in the transistor characteristics, and the VCO gain $K_{VCO}$ and the like are greatly affected thereby. However, the proposed semiconductor integrated circuit does not take into consideration such a large variance in the VCO gain $K_{VCO}$ and the like, and for this reason, the parameter $\omega 1$ greatly varies when the VCO gain $K_{VCO}$ and the like greatly vary.

Therefore, the parameters ω1, ω2 and ω3 are not comprehensively corrected according to the conventional variance correction method, and the variance in the characteristics of the PLL cannot be corrected with a high accuracy.

SUMMARY

According to an aspect of embodiment, a variance correction method includes generating a reference current depending on a resistance within a lowpass filter and outputting the reference current to a voltage controlled oscillator, and correcting characteristics of the lowpass filter and a gain of the voltage controlled oscillator based on an output clock of the voltage controlled oscillator.

It is to be understood that both the foregoing general description and the following detailed description are exemplary and explanatory and are not restrictive of the invention, as claimed.

BRIEF DESCRIPTION OF THE DRAWINGS

FIGS. 22A, 22B, 22C and 22D are diagrams illustrating a manner in which the variance in capacitance is corrected;

FIG. 23 is a circuit diagram illustrating a structure of a lowpass filter in a fourth embodiment; and FIGS. 24A, 24B, 24C and 24D are diagrams illustrating a manner in which the variance in current value is corrected.

DESCRIPTION OF EMBODIMENTS

The embodiments will be described with reference to the accompanying drawings.

According to an aspect of the embodiment, the parameters ω1, ω2 and ω3 including the VCO gain $K_{VCO}$ are comprehensively corrected, so that even if the variance in the characteristics of the PLL is generated due to inconsistencies introduced during the semiconductor process, the characteristics of the PLL are corrected to the designed characteristics regardless of the individual variances.

A description will now be given of the variance correction method, PLL circuit and semiconductor integrated circuit in each embodiment.

Figure 1:
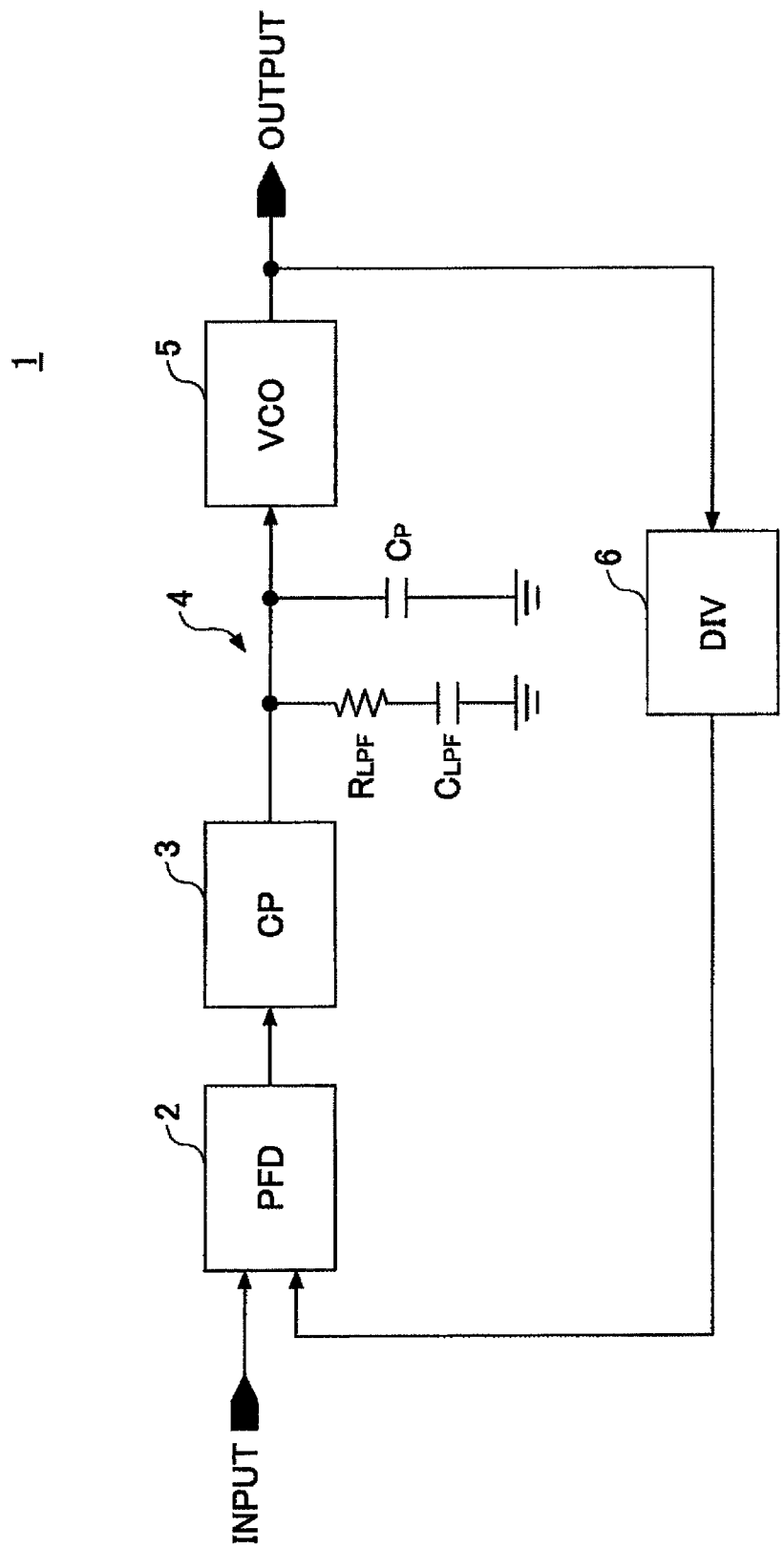
FIG. 1 is a diagram illustrating an example of a conventional PLL circuit.
Figure 2:
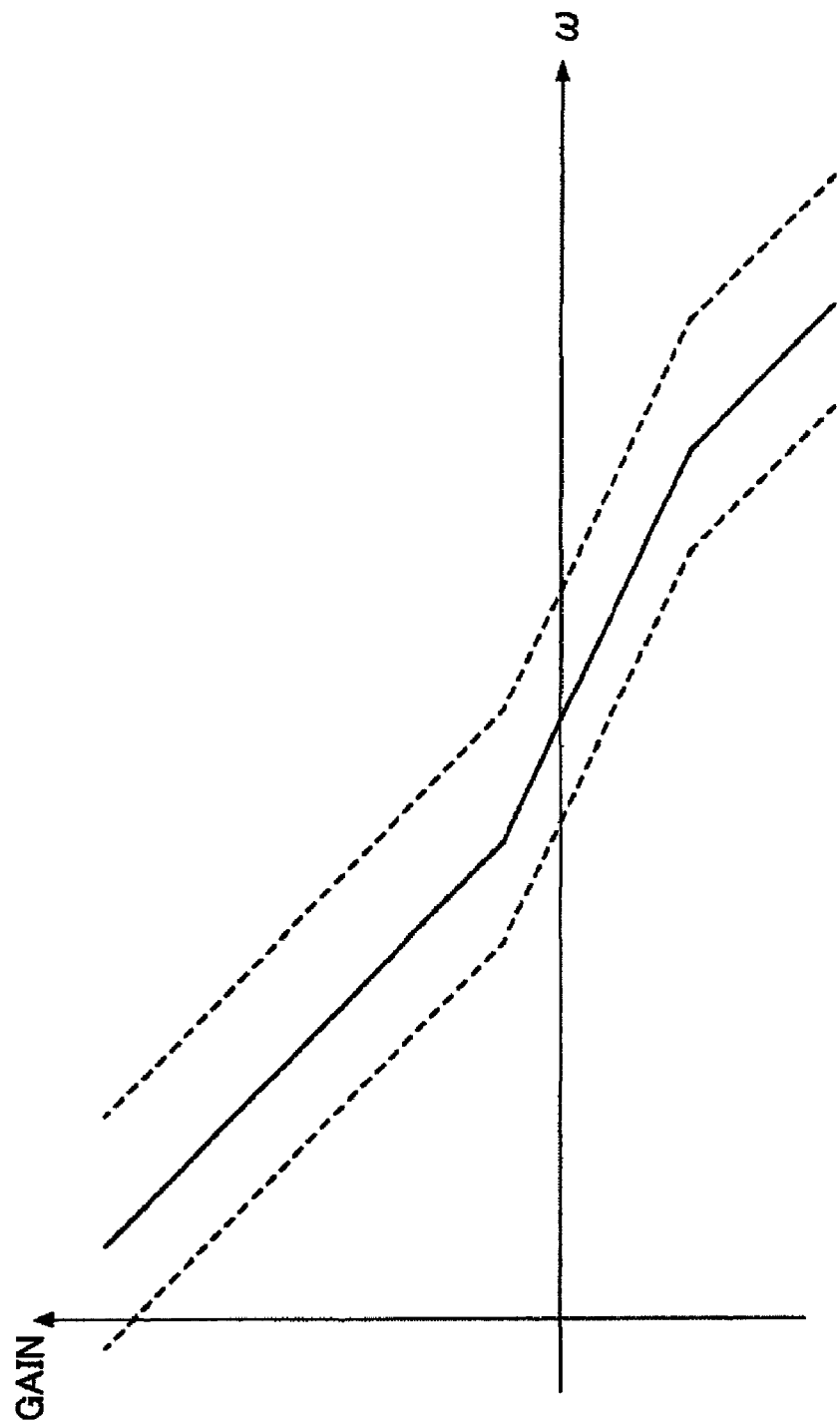
FIG. 2 is a diagram illustrating a state where the variance is generated in the characteristics of the PLL.
Figure 3:
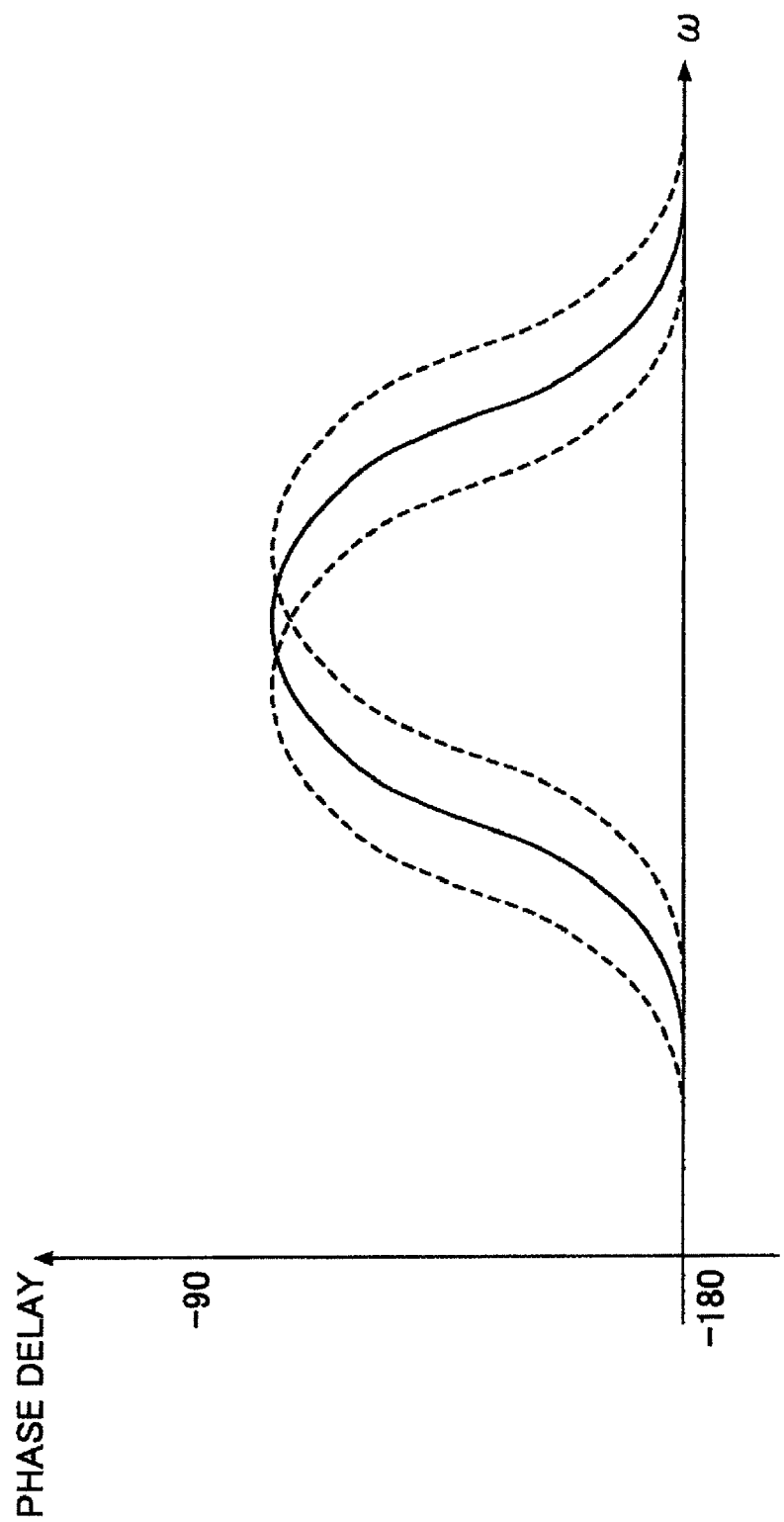
FIG. 3 is a diagram illustrating a state where the variance is generated in the characteristics of the PLL.
Figure 4:
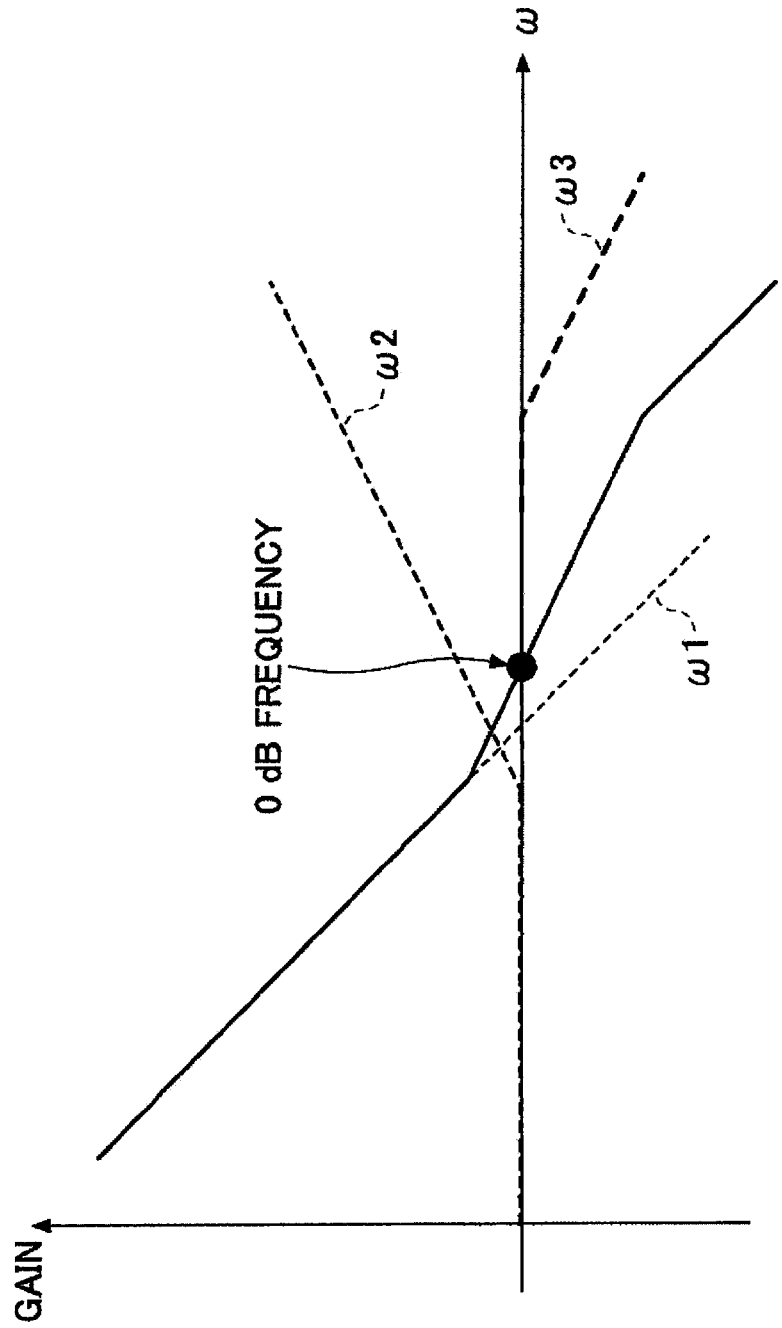
FIG. 4 is a diagram for explaining three parameters ω1, ω2 and ω3.
Figure 5:
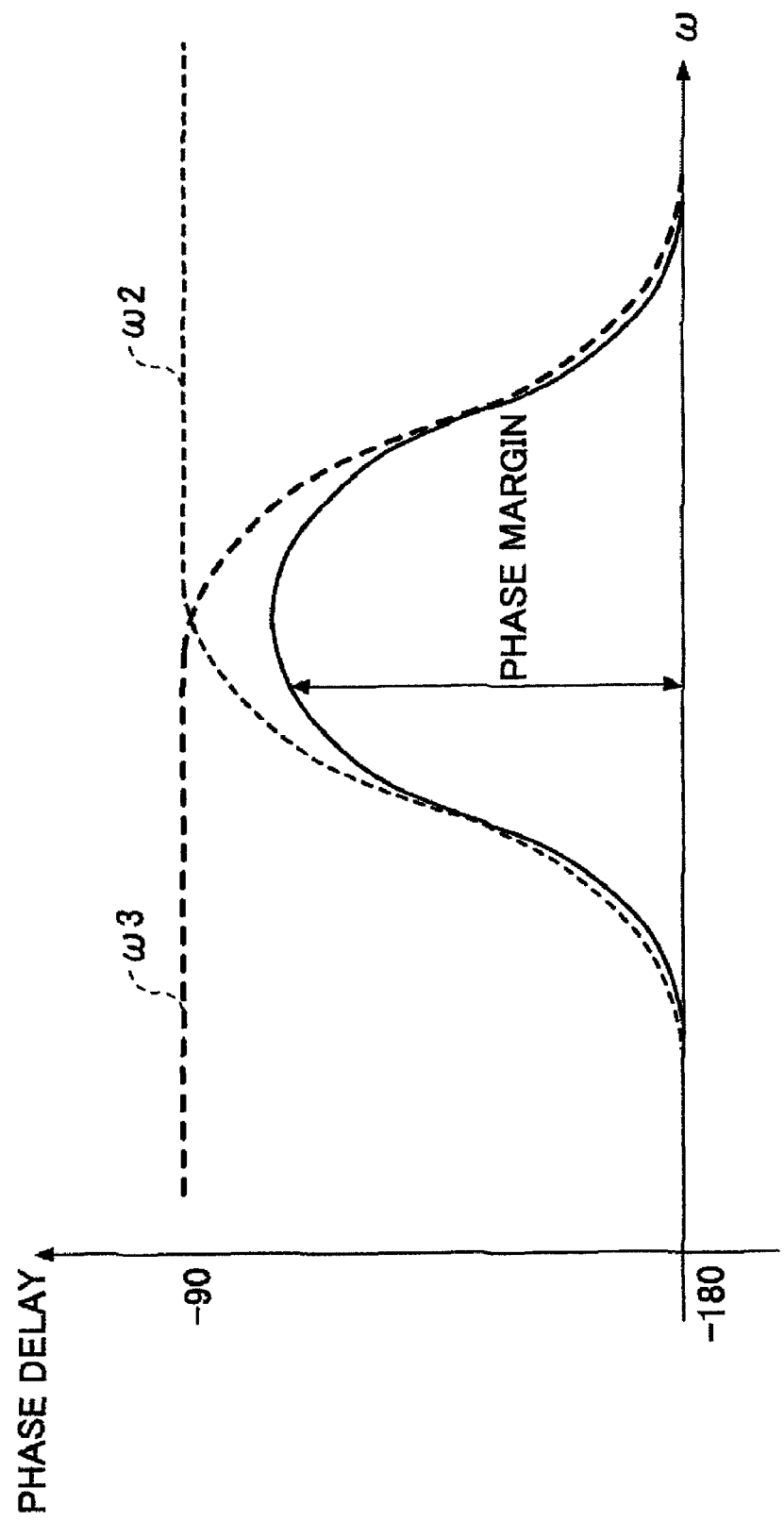
FIG. 5 is a diagram for explaining the three parameters ω1, ω2 and ω3.
Figure 6:
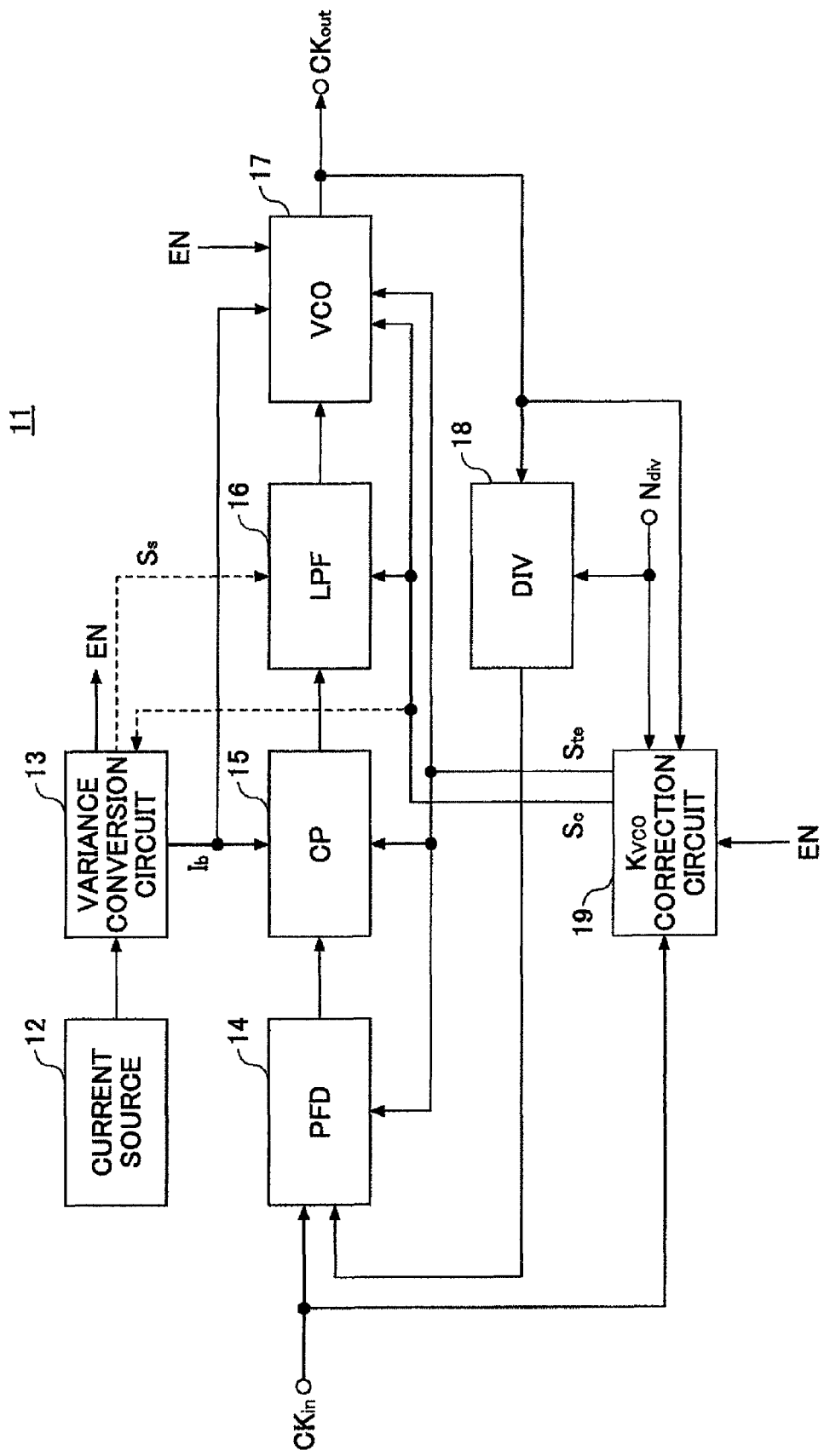
FIG. 6 is a block diagram for explaining one aspect of the embodiment.

FIG. 6 is a block diagram for explaining an aspect of the embodiment. For example, a PLL circuit 1 illustrated in FIG. 6 is provided within a semiconductor integrated circuit that is provided within a semiconductor chip. The PLL circuit 1 includes a current source 12, a variance conversion circuit 13, a Phase Frequency Detector (PFD) 14, a Charge Pump (CP) 15, a Low-Pass Filter (LPF) 16, a Voltage Controlled Oscillator (VCO) 17, a frequency divider (DIV) 18, and a $K_{VCO}$ correction circuit 19 which are coupled as illustrated in FIG. 6. An input clock $CK_{in}$ is input to the PFD 14 and the $K_{VCO}$ correction circuit 19. An output clock $CK_{out}$ is output from the VCO 17 and is also fed back to the PFD 14 via the frequency divider 18. The PFD 14 and the CP 15 have known structures similar to those of the PFD 2 and the CP 3 illustrated in FIG. 1. The LPF 16 may be represented by an equivalent circuit having the same structure as the LPF 4 illustrated in FIG. 1 in a state where a resistance of a resistor part of the LPF 16 or a capacitance of a capacitor part of the LPF is controlled. The VCO 17 has a structure of the so-called multivibrator type VCO or the relaxation oscillator.

The current source 12 has a structure to output a constant current I0 regardless of a voltage change and a temperature change. However, the output current I0 of the current source 12 is affected by the inconsistencies introduced during the semiconductor process. Hence, at the time of tuning the PLL circuit 11 (that is, at the time of tuning the VCO 17), the variance conversion circuit 13 converts the variance in a resistance Rr of a resistor part thereof into a variance in an output current Ib thereof, so that the output current Ib of the variance conversion circuit 13, the resistance Rr (=designed value of $R_{LPF}$) of the resistor part within the variance conversion circuit 13 and a reference voltage Vr satisfy a relationship Ib=Vr/Rr. The variance conversion circuit 13 supplies the output current Ib to the CP 15 and the VCO 17. When the conversion into the variance in the output current Ib by the variance conversion circuit 13 ends, an enable signal EN is supplied to the VCO 17 and the $K_{VCO}$ correction circuit 19.

At the time of a normal operation of the PLL circuit 11, a reference voltage $V_{comp}$ that is input to a comparator within the vCO 17 is the output voltage of the LPF 16. On the other hand, at the time of tuning the PLL circuit 11, the reference voltage $V_{comp}$ which is equal to the reference voltage Vr is input to the comparator within the VCO 17.

If the capacitance of the capacitor part within the VCO 17 is denoted by $C_{VCO}$ and the designed value of an oscillation frequency of the output clock $CK_{out}$ is denoted by fd, the $K_{VCO}$ correction circuit 19 outputs and supplies to the LPF 16 and the VCO 17 a control signal Sc for controlling the capacitances of the capacitor parts within the LPF 16 and the VCO 17 so that the oscillation frequency $f_{VCO}$ of the output clock CKout of the VCO 17 satisfies a relationship $f_{VCO}=Ib\cdot(C_{VCO}\cdot V_{comp})=fd$. Such a control by the $K_{VCO}$ correction circuit 19 is carried out based on the input clock $CK_{in}$, the multiplication factor $N_{div}$ of the frequency divider 18 and the output clock $CK_{out}$, in response to the enable signal EN. The frequency multiplication factor $N_{div}$ is input to the frequency divider 18 and the $K_{VCO}$ correction circuit 19 from an external terminal.

An output current $I_{CP}$ of the CP 15 which uses the output current Ib of the variance conversion circuit 13 as its reference current, and the capacitance $C_{LPF}$ of the capacitor part $C_{LPF}$ within the LPF 16 are linked to the output current Ib of the variance conversion circuit 13 and the capacitance $C_{VCO}$ of the capacitor part $C_{VCO}$ within the VCO 17. Hence, the parameter ω1 described above is corrected so as to satisfy a relationship $\omega 1=(1/2\pi\cdot N_{div})^{1/2}\cdot\{2\pi\cdot Ib/(C_{VCO}\cdot V_{comp})\}^{1/2}\cdot\{I_{CP}/(C_{all}\cdot V_{comp})\}^{1/2}$, where $C_{all}$ denotes a capacitance represented by $C_{all}=C_{LPF}+C_P$. In addition, the parameters ω2 and ω3 are corrected so as to satisfy a relationship $\omega 2=1/(R_{LPF}\cdot C_{LPF})=Ib(Vr\cdot C_{LPF})$.

The $K_{VCO}$ correction circuit 19 supplies to the VCO 17 an end signal Step indicating an end of the tuning when the tuning described above ends, and the reference voltage $V_{comp}$ input to the comparator within the VCO 17 is switched from the output voltage of the LPF 16 to the reference voltage $V_{comp}$ which is equal to the reference voltage Vr described above. In addition, the end signal Step output from the $K_{VCO}$ correction circuit 19 may be supplied to the PFD 14 and the CP 15 as an enable signal, in order to put the PFD 14 and the CP 15 to an enable state only at the time of the normal operation of the PLL circuit 11. Hence, even if the variance is generated in the characteristics of the elements forming each part of the PLL circuit 11 due to the inconsistencies introduced during the semiconductor process, it is possible to correct the parameters, including the output current $I_{CP}$ of the CP 15, the resistance $R_{LPF}$ of the resistor part $R_{LPF}$ and the capacitances $C_{LPF}$ and $C_P$ of the capacitor parts $C_{LPF}$ and $C_P$ within the LPF 16, and the VCO gain $K_{VCO}$ of the VCO 17, to the respective designed values by the tuning described above. Accordingly, it is possible to prevent the variance from being generated in the characteristics of the PLL among the individual PLL circuits 11. This, after the tuning ends, the PLL circuit 11 can perform the normal operation as originally designed.

At the time of tuning the PLL circuit 11, the variance conversion circuit 13 converts the variance in the output current Ib of the variance conversion circuit 13 into the variance in the resistance Rr of the resistor part provided within the variance conversion circuit 13, so that the output current Ib, the resistance Rr and the reference voltage Vr satisfy a relationship Rr=Vr/Ib, and supplies the output current Ib to the CP 15 and the VCO 17. In addition, after the conversion into the variance in the resistance Rr by the variance conversion circuit 13 ends, the enable signal EN may be supplied to the VCO 17 and the $K_{VCO}$ correction circuit 19. In this case, instead of supplying to the LPF 16 and the VCO 17 the control signal Sc which controls the capacitances of the capacitor parts within the LPF 16 and the VCO 17, the $K_{VCO}$ correction circuit 19 may supply to the LPF 16 a control signal Sc for controlling the resistance $R_{LPF}$ of the resistor part $R_{LPF}$ within the LPF 16. In this case, the control signal Sc output from the $K_{VCO}$ correction circuit 19 is also supplied to the variance conversion circuit 13 as indicated by a dotted line in FIG. 6, in order to similarly control an output current of a current adjusting part within the variance conversion circuit 13 or the resistance of the resistor part within the variance conversion circuit 13. In this case, however, the control signal Sc output from the $K_{VCO}$ correction circuit 19 is not supplied to the VCO 17. Furthermore, as indicated by a dotted line in FIG. 6, it is possible to supply a control signal Ss generated within the variance conversion circuit 13 to the LPF 16, in order to finely adjust the resistance $R_{LPF}$ of the resistor part $R_{LPF}$ within the LPF 16.

As described above, this embodiment includes a first correction step which subjects the variance in the output current of the current source 12 to a conversion by the variance conversion circuit 13 at the time of tuning the PLL circuit 11, and a second correction step which corrects the VCO gain $K_{VCO}$ by the $K_{VCO}$ correction circuit 19 when the conversion of the variance ends, and the PLL circuit 11 performs the normal operation after the tuning ends. In the conversion of the variance performed by the variance conversion circuit 13, the current I0 from the current source 12 is corrected to the output current Ib in order to correct the variance in the resistance $R_{LPF}$ within the LPF 16. The correction of the VCO gain $K_{VCO}$ by the $K_{VCO}$ correction circuit 19 may be achieved by correcting the capacitances within the LPF 16 and the VCO 17 or, by correcting the output current of the variance conversion circuit 13 and the resistance within the LPF 16 or, by a combination of these two corrections.

Next, a description will be given of each embodiment of the variance correction method, the PLL circuit and the semiconductor integrated circuit according to the embodiment, by referring to FIG. 7 and the subsequent drawings.

First Embodiment

First, a description will be given of a first embodiment. In this first embodiment and a second embodiment which will be described later, the basic structure of the PLL circuit 11 is as illustrated in FIG. 6. In addition, because each part of the PLL circuit 11 is formed by the semiconductor process with respect to the same wafer, it is possible to effectively utilize the fact that the variance in the characteristics of the elements within each part, such as transistors, capacitors and resistors, is substantially the same.

Figure 7:
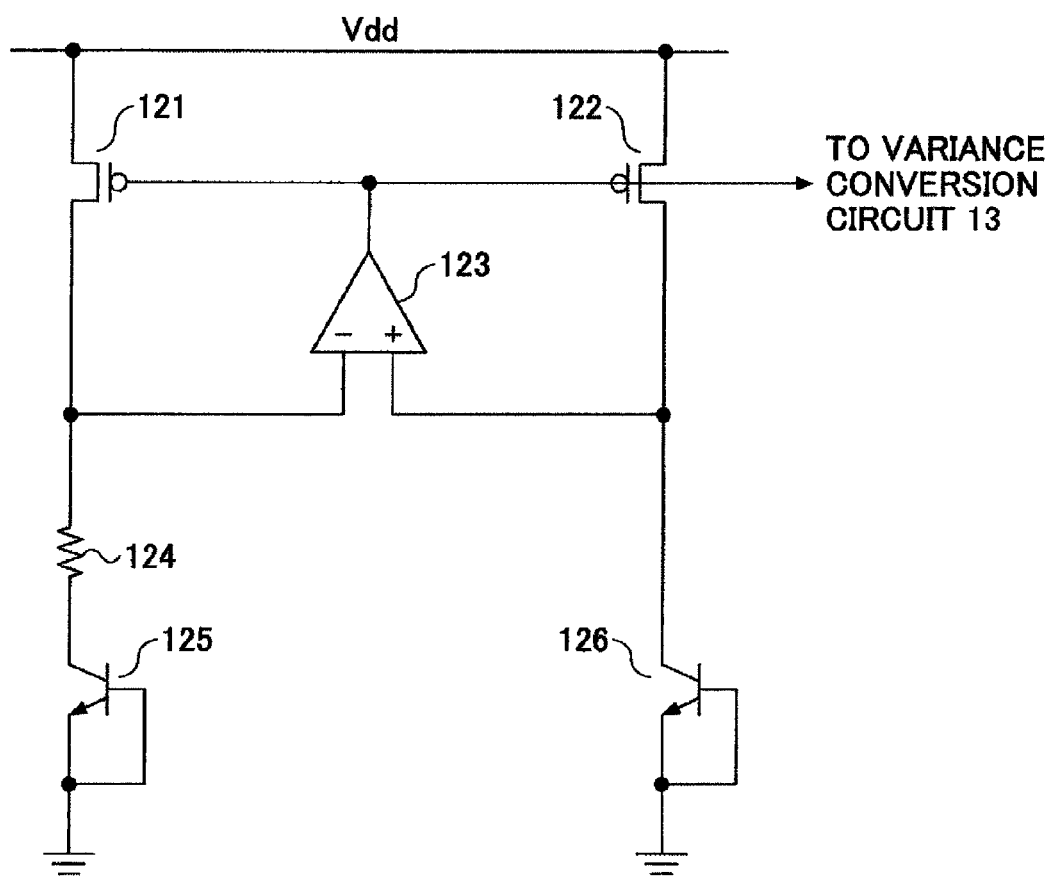
FIG. 7 is a circuit diagram illustrating a structure of a current source in a first embodiment.

FIG. 7 is a circuit diagram illustrating a structure of the current source 12 in the first embodiment. In FIG. 7 and the subsequent drawings, Vdd denotes a power supply voltage. The current source 12 includes P-channel MOS transistors 121 and 122, a comparator 123, a resistor 124 having a positive temperature dependency, and pn transistors 125 and 126 which are coupled as illustrated in FIG. 7. This structure of the current source 12 enables a constant current I0 to be output regardless of the voltage change and the temperature change, as may be readily understood from the Japanese Laid-Open Patent Publication No. 2006-262348, for example.

Figure 8:
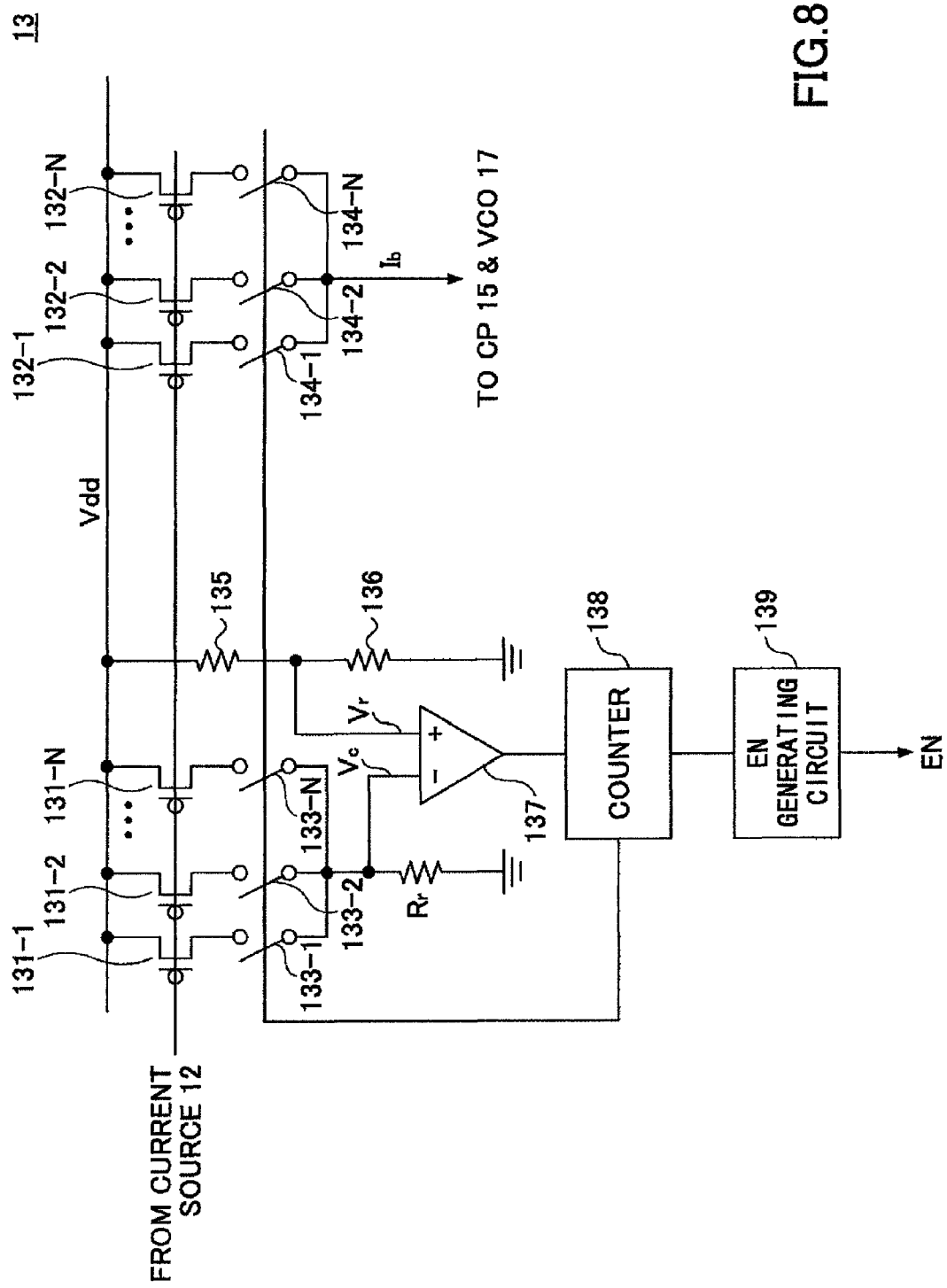
FIG. 8 is a circuit diagram illustrating a structure of a variance conversion circuit in the first embodiment.

FIG. 8 is a circuit diagram illustrating a structure of the variance conversion circuit 13 in the first embodiment. The variance conversion circuit 13 includes P-channel MOS transistors 131-1 through 131-N and 132-1 through 132-N (where N is a natural number greater than or equal to 2), switches 133-1 through 133-N and 134-1 through 134-N, resistors 135 and 136, a resistor Rr, a comparator 137, a counter 138, and an enable signal (EN) generating circuit 139 which are coupled as illustrated in FIG. 8. The structure made up of the P-channel MOS transistors 131-1 through 131-N and the switches 133-1 through 133-N is the same as the structure made up of the P-channel MOS transistors 132-1 through 132-N and the switches 134-1 through 134-N. Corresponding switches, one selected from the switches 133-1 through 133-N and the other selected from the switches 134-1 through 134-N, are turned ON or OFF in a similar manner. Hence, a mirror ratio of a current mirror circuit becomes variable.

Figure 9:
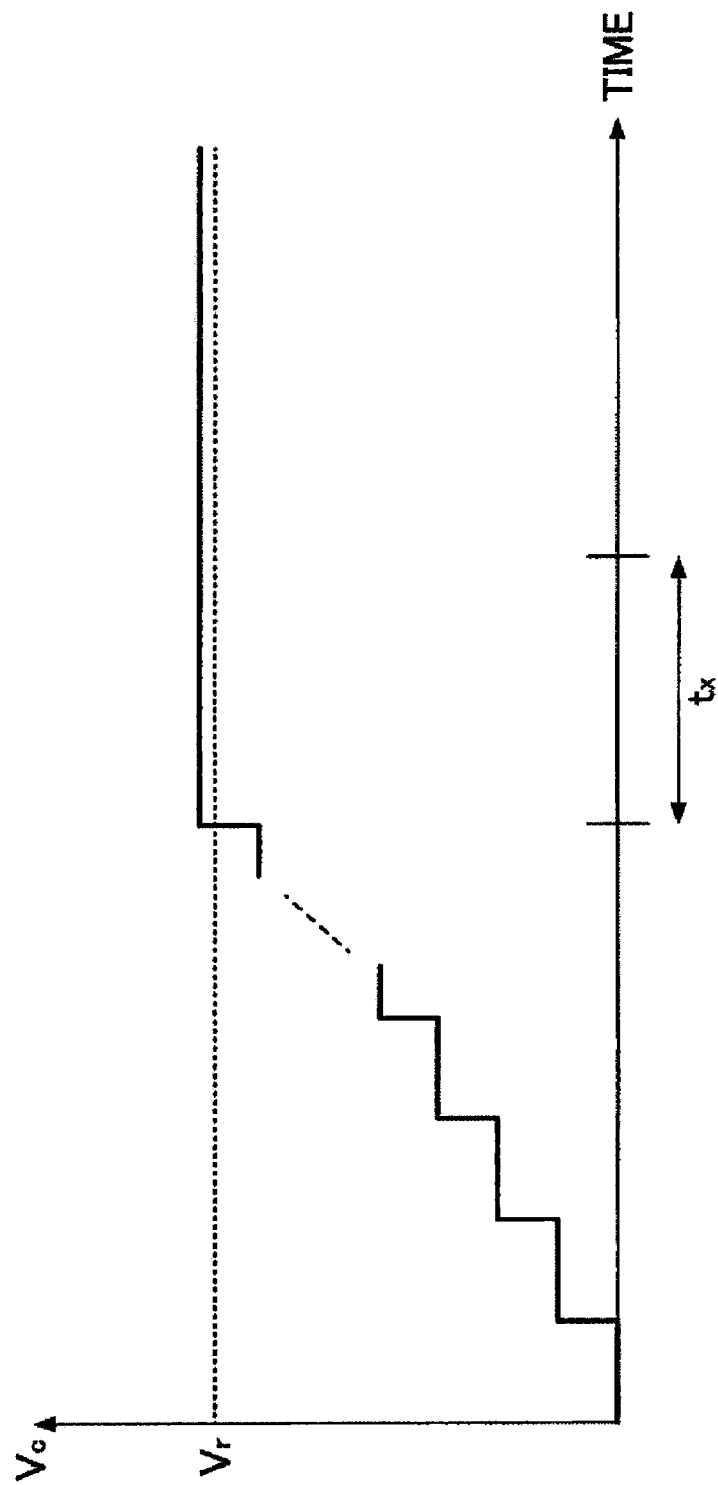
FIG. 9 is a diagram for explaining an operation of a counter within the variance conversion circuit.

The reference voltage Vr obtained by a resistance voltage divider made up of the resistors 135 and 136 is supplied to one input terminal of the comparator 137. A voltage Vc obtained from a node which couples the resistor Rr to the switches 133-1 through 133-N is supplied to the other input terminal of the comparator 137. The counter 138 outputs a control signal which increases the number of switches, from among the switches 133-1 through 133-N and 134-1 through 134-N, to be controlled to the ON state in order to increase the voltage Vc if the voltage Vc has not reached the reference voltage Vr. For example, the output of the counter 138 has N bits. FIG. 9 is a diagram for explaining an operation of the counter 138. When a predetermined time tx elapses from a time when the voltage Vc has reached the reference voltage Vr, the counter 138 supplies a trigger signal to the EN generating circuit 139, and the EN generating circuit 139 generates and outputs the enable signal EN which is supplied to the VCO 17, the $K_{VCO}$ correction circuit 19 and the like.

Accordingly, the output current I0 of the current source 12 is affected by the inconsistencies introduced during the semiconductor process, but at the time of tuning the PLL circuit 11, the variance conversion circuit 13 converts the variance in the resistance Rr of the resistor Rr within the variance conversion circuit 13 into the variance in the output current Ib of the variance conversion circuit 13, so that the output current Ib, the resistance Rr and the reference voltage Vr satisfy the relationship Ib=Vr/Rr. Consequently, the output current Ib which is obtained by varying the mirror ratio of the current mirror circuit is supplied to the CP 15 and the VCO 17. The resistance Rr is equal to the resistance $R_{LPF}$ of the resistor part $R_{LPF}$ within the LPF 16. In addition, when the conversion into the variance in the output current Ib by the variance conversion circuit 13 ends, the enable signal EN is supplied to the VCO 17 and the $K_{VCO}$ correction circuit 19.

Figure 10:
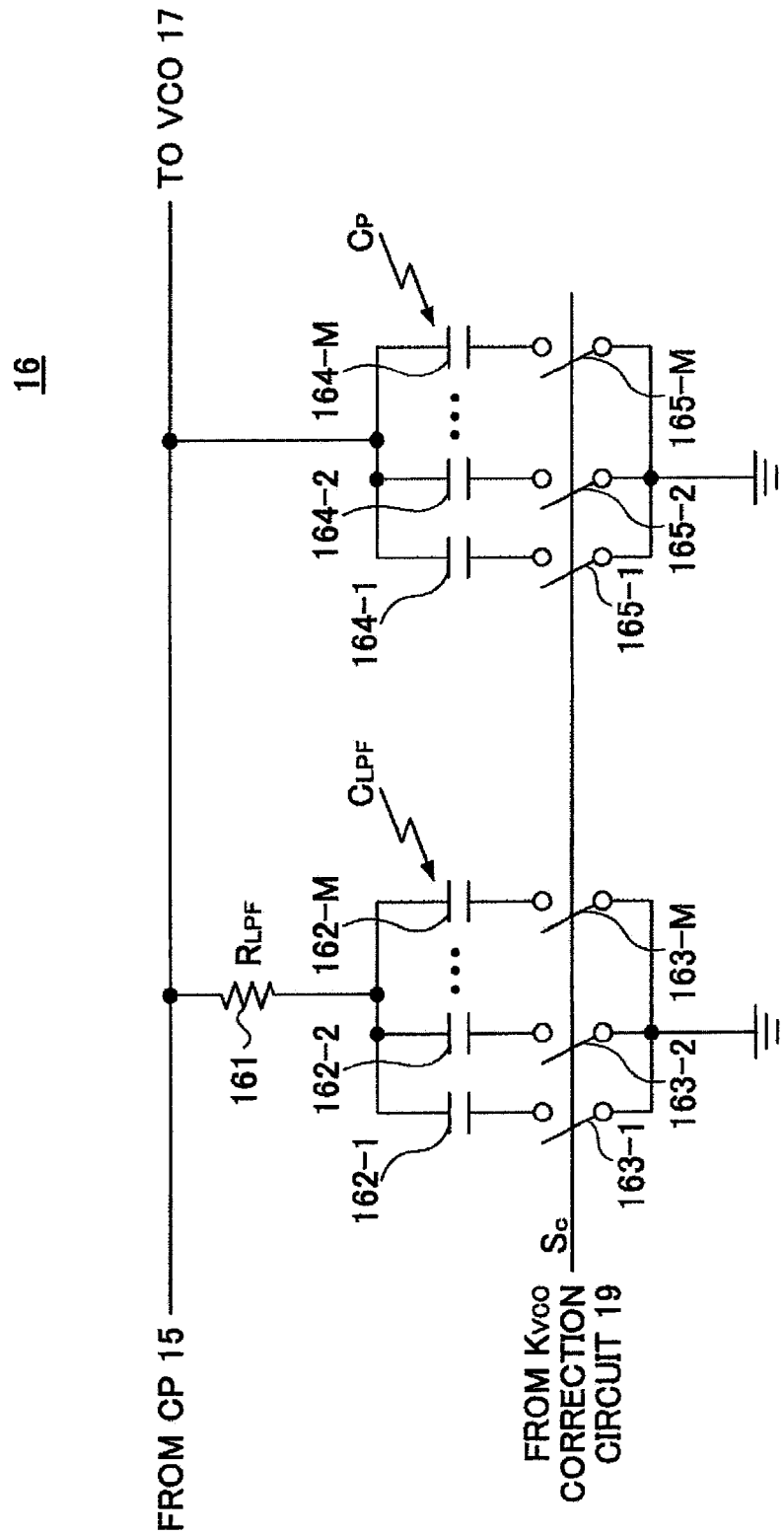
FIG. 10 is a circuit diagram illustrating a structure of a lowpass filter in the first embodiment.

FIG. 10 is a circuit diagram illustrating a structure of LPF 16. The LPF 16 includes the resistor part $R_{LPF}$ and the capacitor parts $C_{LPF}$ and $C_P$ which are coupled as illustrated in FIG. 10. The capacitor part CLPF includes capacitors 162-1 through 162-M (M is a natural number greater than or equal to 2) having the same capacitance, and switches 163-1 through 163-M. On the other hand, the capacitor part $C_P$ includes capacitors 164-1 through 164-M having the same capacitance, and switches 165-1 through 165-M. The switches 163-1 through 163-M and 165-1 through 165-M are turned ON and OFF in response to the control signal from the $K_{VCO}$ correction circuit 19. The capacitances $C_{LPF}$ and $C_P$ of the capacitor parts $C_{LPF}$ and $C_P$ change proportionally to the number of switches 163-1 through 163-M and 165-1 through 165-M that are turned ON.

Figure 11:
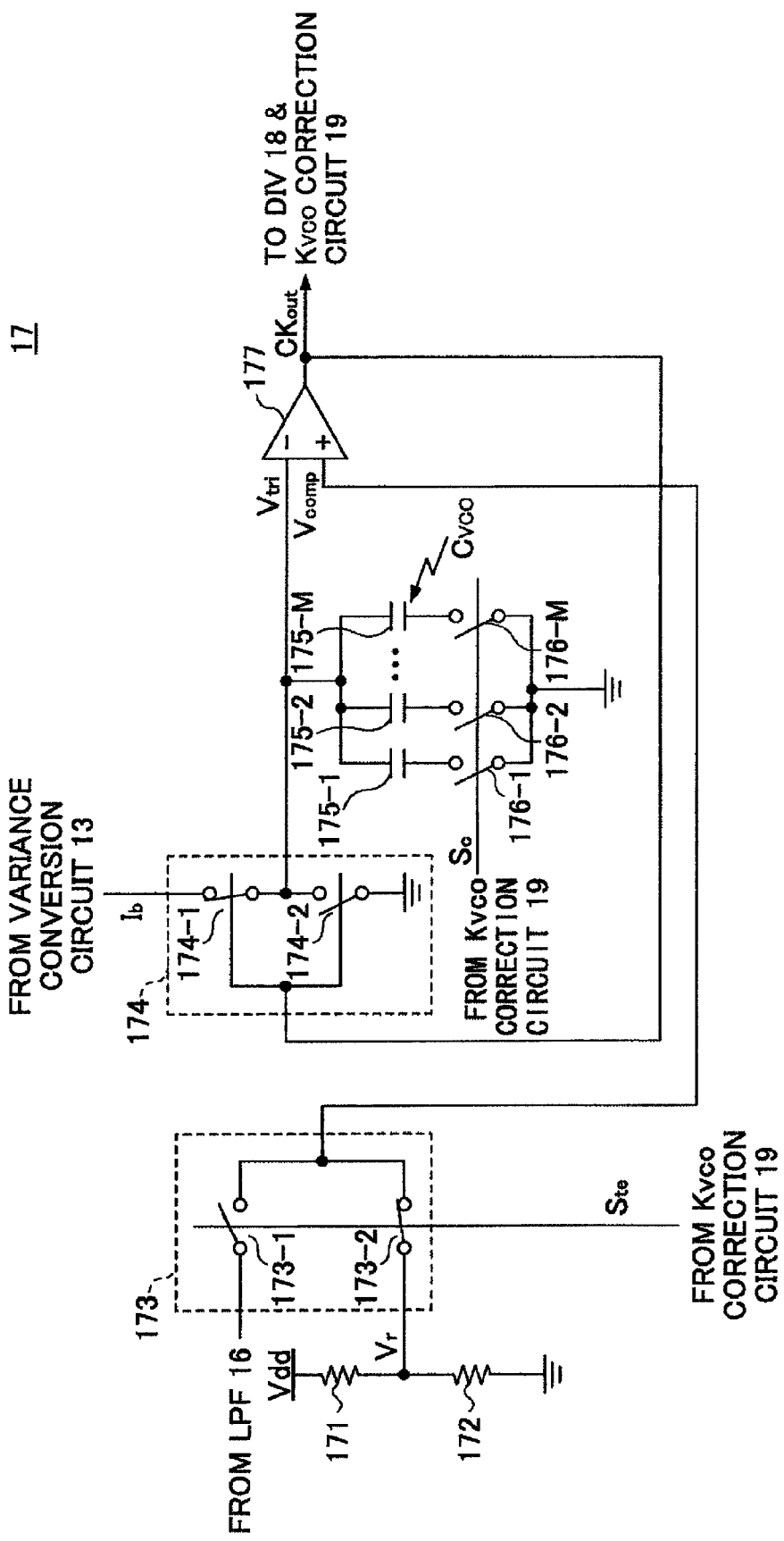
FIG. 11 is a circuit diagram illustrating a structure of a voltage controlled oscillator in the first embodiment.

FIG. 11 is a circuit diagram illustrating a structure of the VCO 17 in the first embodiment. The VCO 17 includes resistors 171 and 172, switch parts 173 and 174, capacitors 175-1 through 175-M having the same capacitance, switches 176-1 through 176-M, and a comparator 177 which are coupled as illustrated in FIG. 11. The resistors 171 and 172 are the same as the resistors 135 and 136 illustrated in FIG. 8, and the reference voltage Vr obtained by the resistance voltage divider is input to a switch 173-2 of the switch part 173. The output of the LPF 16 is input to a switch 173-1 of the switch part 173. In response to the control signal Step from the $K_{VCO}$ correction circuit 19, the switch 173-1 is OFF and the switch 173-2 is ON at the time of tuning, and the switch 173-1 is ON and the switch 173-2 is OFF at the time of the normal operation. An output of the switch part 173 is supplied to one input terminal of the comparator 177 as the reference voltage $V_{comp}$. An output voltage Vrti of the switch part 174 is supplied to the other input terminal of the comparator 177. The switches 176-1 through 176-M are turned ON and OFF in response to the control signal Sc from the $K_{VCO}$ correction circuit 19. The comparator 177 outputs a pulse of the output clock $CK_{out}$ every time the output voltage Vtri of the switch part 174 reaches the reference voltage $V_{comp}$. During a low-level period of the output clock $CK_{out}$, a switch 174-1 is ON and a switch 174-2 is OFF in the switch part 174. On the other hand, during a high-level period of the output clock $CK_{out}$, the switch 174-1 is OFF and the switch 174-2 is ON in the switch part 174. For example, the capacitances of the capacitors 175-1 through 175-M are the same as the capacitances of the capacitors 162-1 through 162-M and 164-1 through 164-M within the LPF 16.

Figure 12:
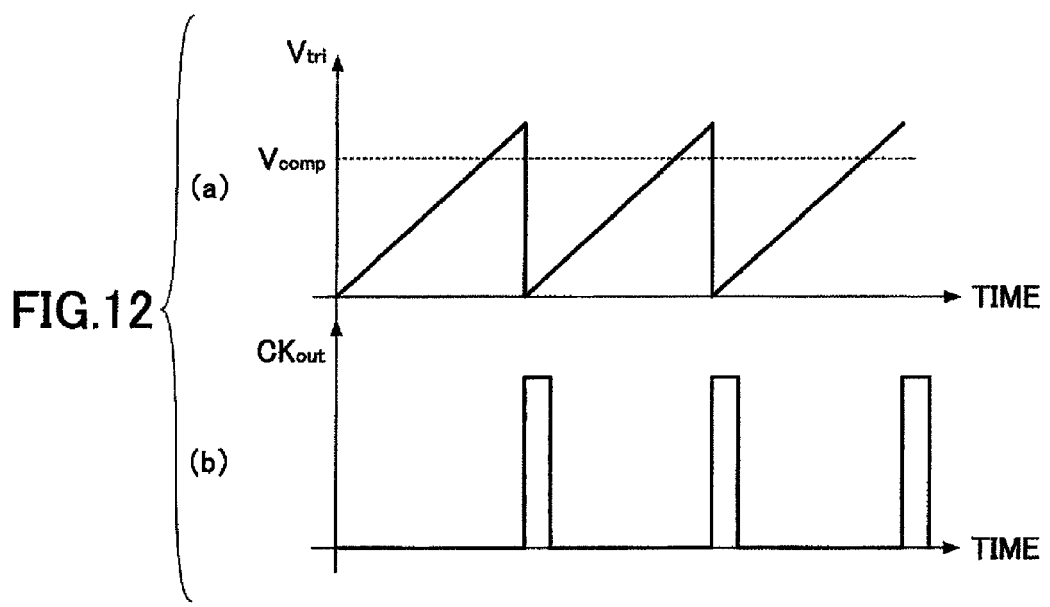
FIG. 12 is a timing chart for explaining an operation of the voltage controlled oscillator.

FIG. 12 is a timing chart for explaining an operation of the VCO 17. In FIG. 12, (a) illustrates the output voltage Vtri of the switch part 174, and (b) illustrates the output clock $CK_{out}$ that is output from the comparator 177.

By the VCO 17 having the structure described above, it is possible to stabilize the oscillation frequency $f_{VCO}$ and the VCO gain $K_{VCO}$, as indicated by the following formulas. If the designed value of the oscillation frequency of the output clock $CK_{out}$ is denoted by fd, and the capacitance of the capacitor part $C_{VCO}$ formed by the capacitors 175-1 through 175-M whose ON and OFF states are controlled by the switches 176-1 through 176-M is denoted by $C_{VCO}$, an oscillation period $T_{VCO}$ can be represented by $T_{VCO} = (C_{VCO} \cdot V_{comp})/Ib$.

$$f_{VCO} = Ib/(C_{VCO} \cdot V_{comp})$$

$$|K_{VCO}| = 2\Pi \cdot |df_{VCO}/dV_{comp}|$$
$$= 2\Pi \cdot \{Ib/(C_{VCO} \cdot V_{comp})\} \cdot (1/V_{comp})$$

Figure 13:
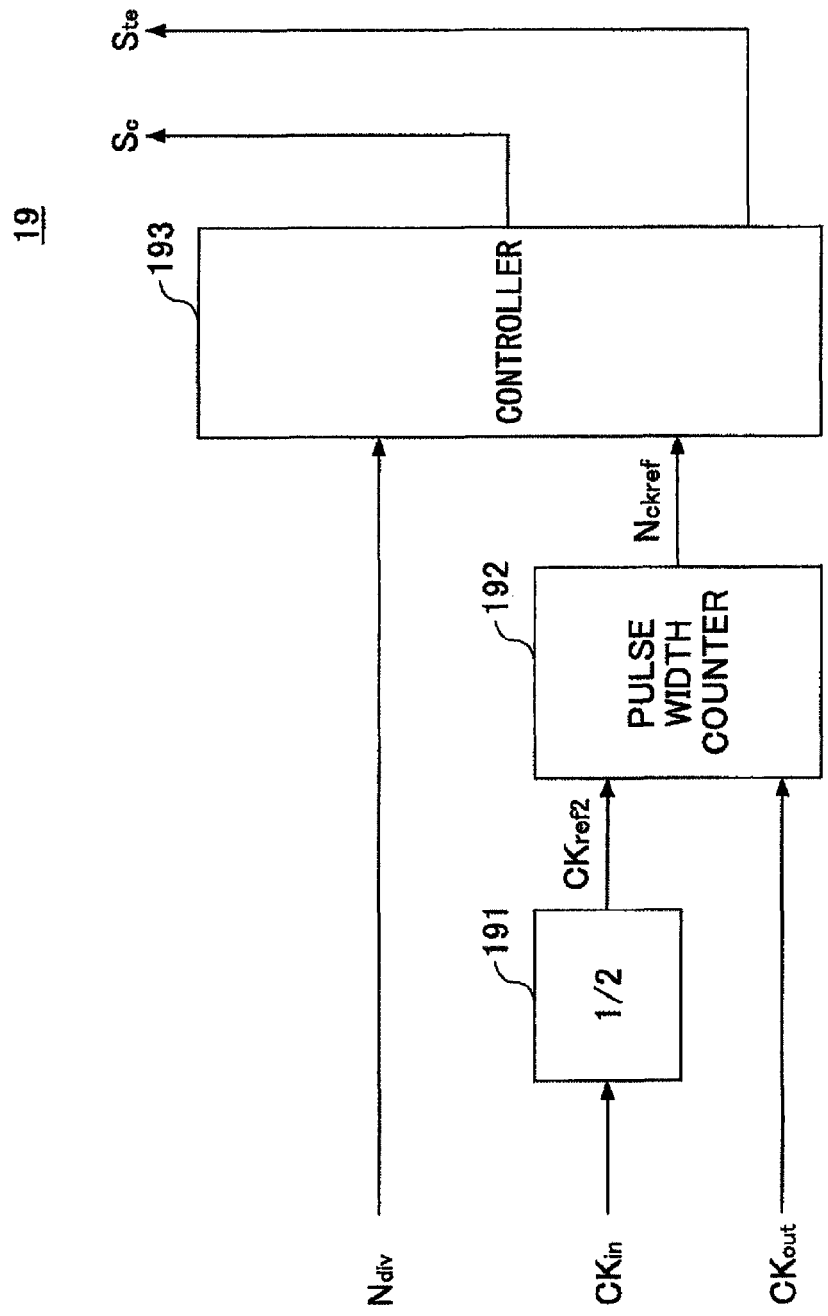
FIG. 13 is a block diagram illustrating a structure of a $K_{VCO}$ correction circuit in the first embodiment.

FIG. 13 is a block diagram illustrating a structure of the $K_{VCO}$ correction circuit 19. The $K_{VCO}$ correction circuit 19 includes a ½ frequency divider 191, a pulse width counter 192, and a controller 193 which are coupled as illustrated in FIG. 13. The input clock $CK_{in}$ is input to the ½ frequency divider 191 and subjected to a ½-frequency division, and a clock $CK_{ref2}$ output from the ½ frequency divider 191 is input to a data input terminal of the pulse width counter 192. The output clock $CK_{out}$ from the VCO 17 is input to a clock input terminal of the pulse width counter 192. An output $N_{ckref}$ of the pulse width counter 192 is input to the controller 193. The controller 193 also receives the multiplication factor $N_{div}$ from the external terminal.

Figure 14:
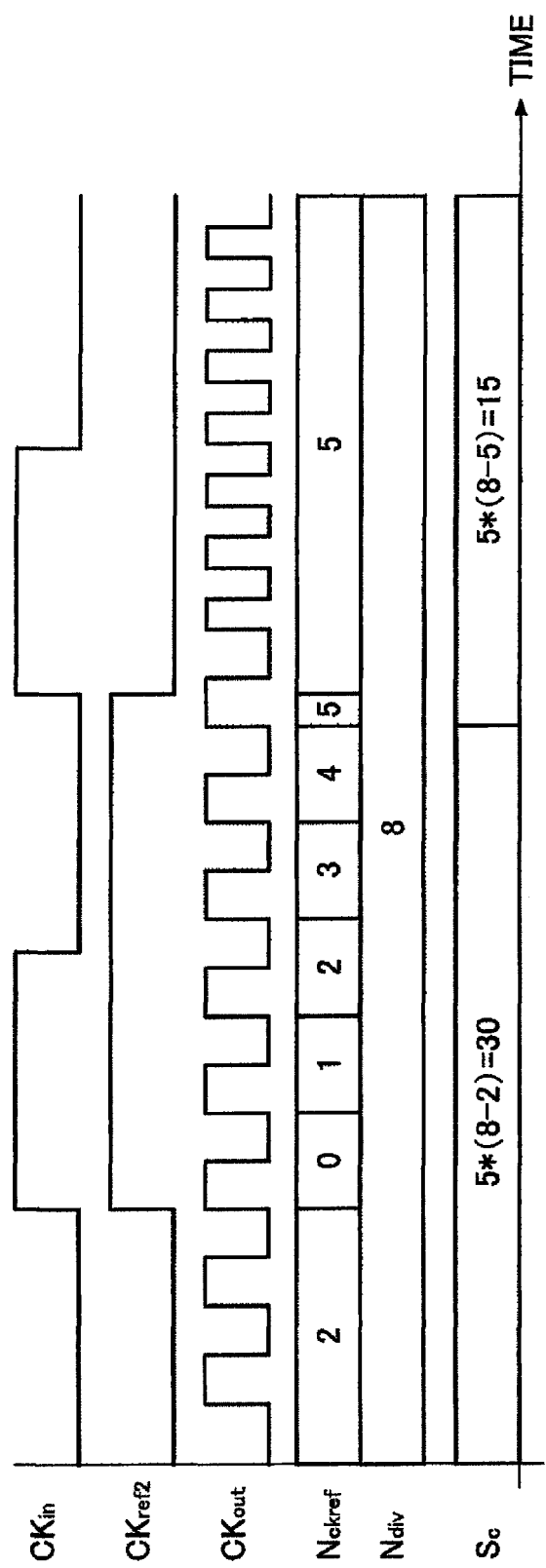
FIG. 14 is a timing chart for explaining an operation of the $K_{VCO}$ correction circuit in the first embodiment.

FIG. 14 is a timing chart for explaining an operation of the $K_{VCO}$ correction circuit 19. As may be seen from FIG. 14, the controller 193 generates an outputs an M-bit control signal Sc for controlling the ON and OFF states of the switches 163-1 through 163-M within the LPF 16 and the switches 176-1 through 176-M within the VCO 17, so that the output $N_{ckref}$ of the pulse width counter 192 becomes equal to the multiplication factor $N_{div}$, that is, the difference between $N_{ckref}$ and $N_{div}$ becomes 0. The control signal Sc may be represented by $Sc = f\{N_{ckref} - N_{div}\}$.

An internal counter (not illustrated) is provided within the controller 193 to count the number of times the difference between $N_{ckref}$ and $N_{div}$ becomes 0. The controller 193 generates and outputs the end signal Step when a counted value $N_{zero}$ of this internal counter reaches a predetermined value.

Accordingly, the $K_{VCO}$ correction circuit 19 controls the capacitance $C_{VCO}$ of the capacitor part $C_{VCO}$ within the VCO 17 and the capacitances $C_{LPF}$ and $C_P$ of the capacitor parts $C_{LPF}$ and $C_P$ within the LPF 16 so that the following formula stands, where fd denotes the designed value of the oscillation frequency of the output clock $CK_{out}$.

$$f_{VCO}=Ib/(C_{VCO}\cdot V_{comp})=fd$$

In addition, because $f_{VCO}$ can be represented by $f_{VCO}=Ib/(C_{VCO}\cdot V_{comp})$, the absolute value of the VCO gain $K_{VCO}$ can be represented by the following formula.

$$|K_{VCO}| = 2\Pi \cdot |d f_{VCO}/dV_{comp}|$$
$$= 2\Pi \cdot \{Ib/(C_{VCO}\cdot V_{comp})\}\cdot(1/V_{comp})$$
$$= 2\Pi \cdot f_{VCO}\cdot(1/V_{comp}) \approx fd\cdot(1/V_{comp})$$

In other words, the VCO gain $K_{VCO}$ can be corrected to the value $fd/V_{comp}$ by performing the tuning described above, regardless of the variance in the current I0 of the current source 12 and the variance in the capacitances within the LPF 16 and the VCO 17.

According to this embodiment, in a case where the current I0 from the current source 12 varies greatly, the current I0 is once converted into a smaller current Ib by the variance conversion circuit 13. In this case, the parameter ω1 described above is corrected by controlling the capacitance within the VCO 17 to become smaller by the $K_{VCO}$ correction circuit 19. In addition, the parameters ω2 and ω3 are corrected by controlling the capacitance within the LPF 16 to become smaller by the $K_{VCO}$ correction circuit 19.

In other words, because the output current $I_{CP}$ of the CP 15 and the capacitance $C_{LPF}$ of the capacitor part $C_{LPF}$ within the LPF 16 are linked to the output current Ib of the variance conversion circuit 13 and the capacitance $C_{VCO}$ of the capacitor part $C_{VCO}$ within the VCO 17, $Ib/(C_{VCO}\cdot V_{comp})$ and $Ib/(C_{all}\cdot V_{comp})$ become proportional to the oscillation frequency $f_{VCO}$ of the VCO 17 if the output current $I_{CP}$ of the CP 15 is set to an arbitrary multiple of the output current Ib of the variance conversion circuit 13. Hence, the parameter ω1 described above is corrected so as to satisfy a relationship $\omega 1=\{1/(2\pi\cdot N_{div})\}^{1/2}\cdot\{2\pi\cdot Ib/(C_{VCO}\cdot V_{comp})\}^{1/2}\cdot\{I_{CP}/C_{all}\}^{1/2}=(1/N_{div})^{1/2}\cdot\{Ib/(C_{VCO}\cdot V_{comp})\}^{1/2}\cdot\{I_{CP}/(C_{all}\cdot V_{comp})\}^{1/2}=(1/N_{div})^{1/2}\cdot\alpha\cdot f_{VCO}$, where α is an arbitrary constant. In addition, the parameters ω2 and ω3 are corrected so as to satisfy a relationship $\omega 2=1/(R_{LPF}\cdot C_{LPF})=Ib/(Vr\cdot C_{LPF})$.

Figure 15:
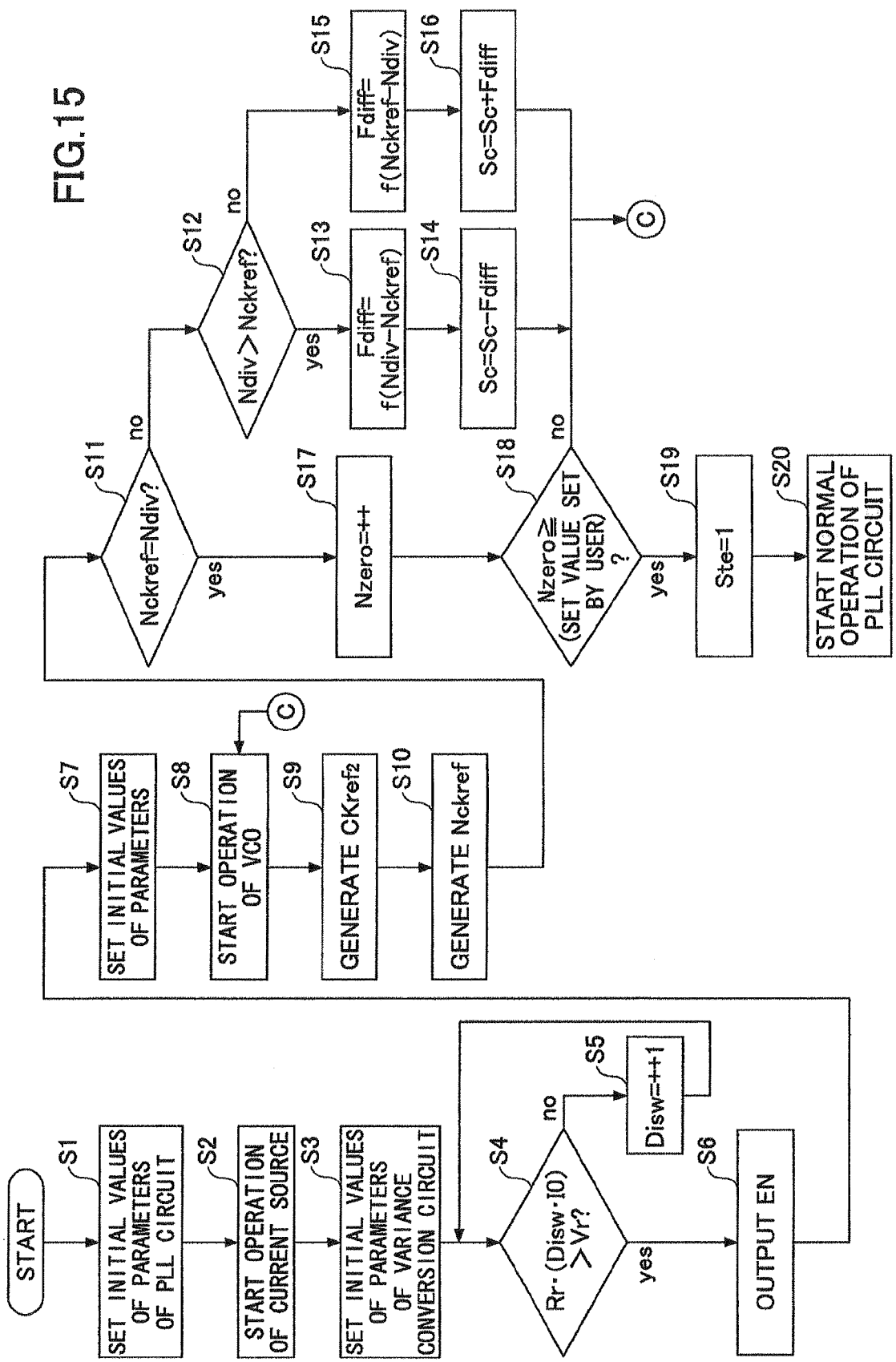
FIG. 15 is a flow chart for explaining an operation of the first embodiment.

FIG. 15 is a flow chart for explaining an operation of the first embodiment. In FIG. 15, processes of steps S3 through S6 are performed by the variance conversion circuit 13, and processes of steps S7 through S19 are performed by the $K_{VCO}$ correction circuit 19.

A step S1 sets the end signal Step that is output from the $K_{VCO}$ correction circuit 19 to Ste=0 at the time of the tuning, sets the reference voltage $V_{comp}$ within the VCO 17 to Vdd/2, for example, and sets the multiplication factor $N_{div}$ of the frequency divider 18 to a predetermined value, in order to set the parameters of the PLL circuit 11 to initial values. A step S2 starts the operation of the current source 12 and supplies the current I0 from the current source 12 to the variance conversion circuit 13.

The step S3 sets the output (counted value $D_{isw}$) of the counter 138 within the variance conversion circuit 13 to 0, sets the reference voltage Vr to a predetermined value, and sets the enable signal EN to 0, in order to set the parameters of the variance conversion circuit 13 to initial values. The step S4 decides whether $Rr\cdot(D_{isw}\cdot I0)>Vr$. If the decision result in the step S4 is NO, the step S5 increments the counted value $D_{isw}$ by 1, and the process returns to the step S4. On the other hand, if the decision result in the step S4 is YES, the step S6 outputs the enable signal EN which indicates that the conversion of the variance in the resistance Rr into the variance in the output current Ib has ended, and the process advances to the step S7.

The step S7 sets the control signal Sc to a predetermined value, sets the multiplication factor $N_{div}$ of the frequency divider 18 to a predetermined value, sets the output (counted value) $N_{ckref}$ of the pulse width counter 192 to 0, and sets the counted value $N_{zero}$ of the internal counter of the controller 193 to 0, in order to set the parameters of the $K_{VCO}$ correction circuit 19 to initial values. The step S8 starts the operation of the VCO 17 in response to the enable signal EN. The step S9 subjects the input clock $CK_{in}$ to a ½-frequency division by the frequency divider 191 to generate the clock $CK_{ref2}$ illustrated in FIG. 14, the step S10 generates the output $N_{ckref}$ by the pulse width counter 192, and the process then advances to the step S11.

The step S11 decides whether $N_{ckref}=N_{div}$. The process advances to the step S12 if the decision result in the step S11 is NO. The step S12 decides whether $N_{ckref}>N_{div}$. The process advances to the step S13 if the decision result in the step S12 is YES, and the process advances to the step S15 if the decision result in the step S12 is NO. The step S13 obtains $F_{diff}=f(N_{div}-N_{ckref})$, the step S14 obtains $Sc=Sc-F_{diff}$, and the process returns to the step S8. The step S15 obtains $F_{diff}=f(N_{ckref}-N_{div})$, the step S16 obtains $Sc=Sc+F_{diff}$, and the process returns to the step S8.

On the other hand, if the decision result in the step S11 is YES, the step S17 increments the counted value $N_{zero}$ of the internal counter of the controller 193 by 1. The step S18 decides whether $N_{zero}$ is greater than or equal to a set value set by the user, and the process returns to the step S8 if the decision result in the step S18 is NO. If the decision result in the step S18 is YES, the step S19 sets the end signal Step to Ste=1 at the time of the normal operation, and switches the switches 173-1 and 173-2 of the switch part 173 so that the output voltage of the LPF 16 is supplied to the comparator 177 via the switch part 173. After the step S19, the step S20 starts the normal operation of the PLL circuit 11.

Second Embodiment

Next, a description will be given of a second embodiment.

Figure 16:
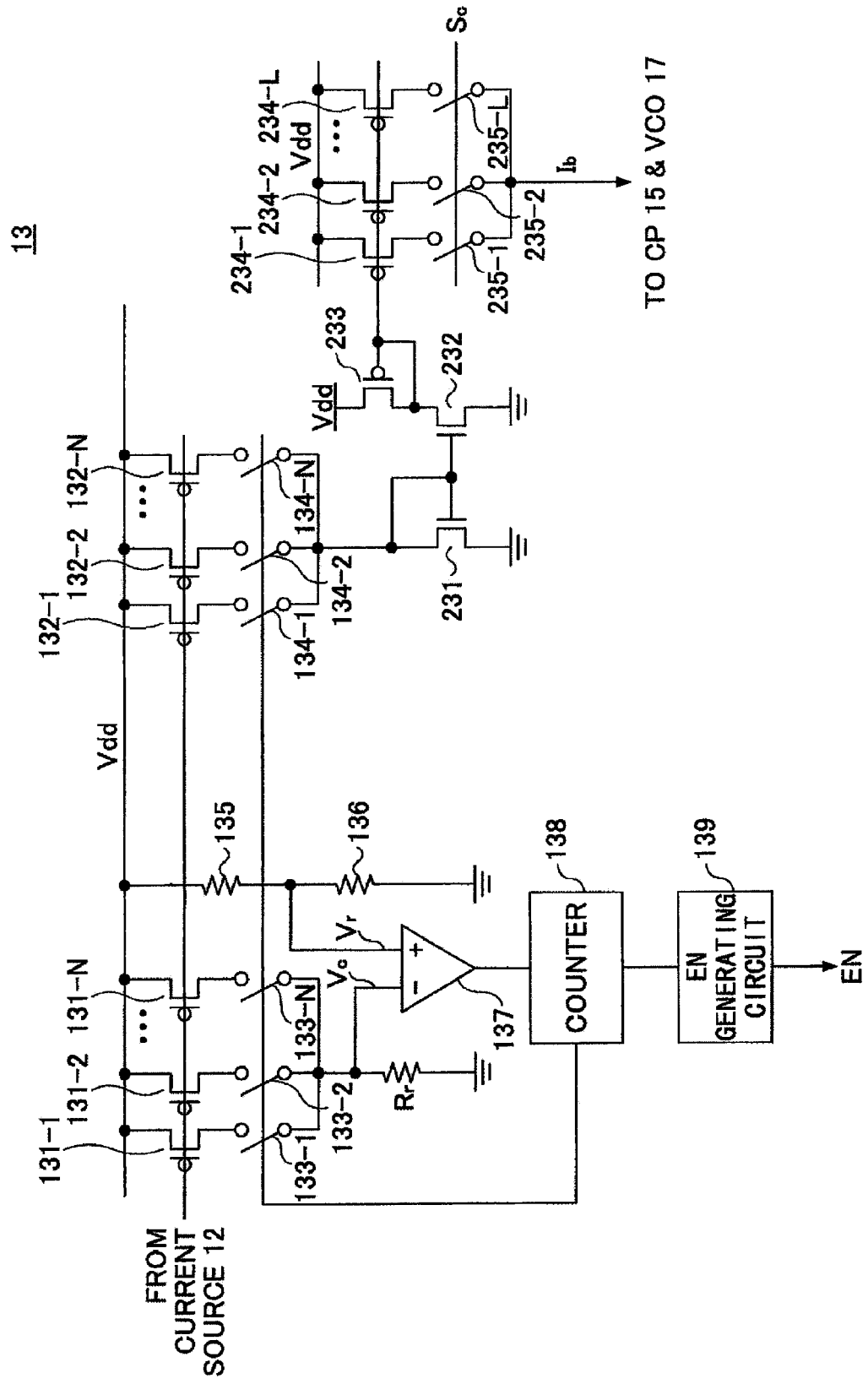
FIG. 16 is a circuit diagram illustrating a structure of a variance conversion circuit in a second embodiment.

FIG. 16 is a circuit diagram illustrating a structure of a variance conversion circuit 13 in the second embodiment. In FIG. 16, those parts that are the same as those corresponding parts in FIG. 8 are designated by the same reference numerals, and a description thereof will be omitted. In addition to a first circuit part having the structure illustrated in FIG. 8, the variance conversion circuit 13 illustrated in FIG. 16 further includes a second circuit part having N-channel MOS transistors 231 and 232, P-channel MOS transistors 233, 234-1 through 234-L (L is a natural number greater than or equal to 2), and switches 235-1 through 235-L which are coupled as illustrated in FIG. 16. The ON and OFF states of the switches 235-1 through 235-L are controlled by the control signal Sc from the $K_{vco}$ correction circuit 19. The P-channel MOS transistors 234-1 through 234-L and the switches 235-1 through 235-L form a current adjusting part which adjusts the output current Ib depending on an L-bit control signal Sc.

Figure 17:
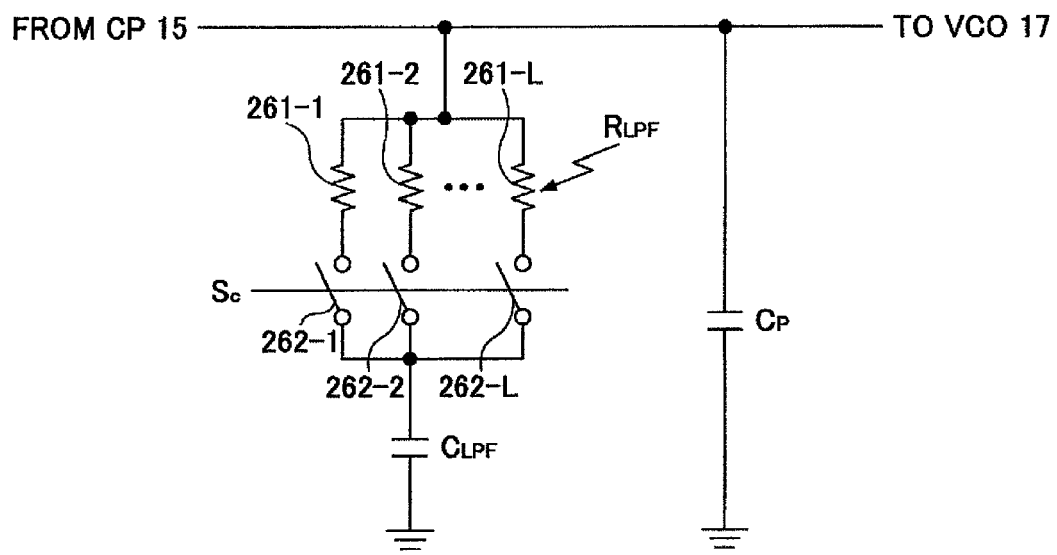
FIG. 17 is a circuit diagram illustrating a structure of a lowpass filter in the second embodiment.

FIG. 17 is a circuit diagram illustrating a structure of a LPF 16 in the second embodiment. In FIG. 17, those parts that are the same as those corresponding parts in FIG. 10 are designated by the same reference numerals, and a description thereof will be omitted. A resistor part $R_{LPF}$ is formed by resistors 261-1 through 261-L having the same resistance and switches 262-1 through 262-L which are coupled as illustrated in FIG. 17. The ON and OFF states of the switches 261-1 through 261-L are controlled by the L-bit control signal Sc from the $K_{VCO}$ correction circuit 19. Accordingly, corresponding switches, one selected from the switches 234-1 through 234-L within the variance conversion circuit 13 and the other selected from the switches 261-1 through 261-L within the LPF 16, are turned ON or OFF in a similar manner. The resistance $R_{LPF}$ of the resistor part $R_{LPF}$ changes inversely proportionally to the number of switches 262-1 through 262-L that are turned ON.

Figure 18:
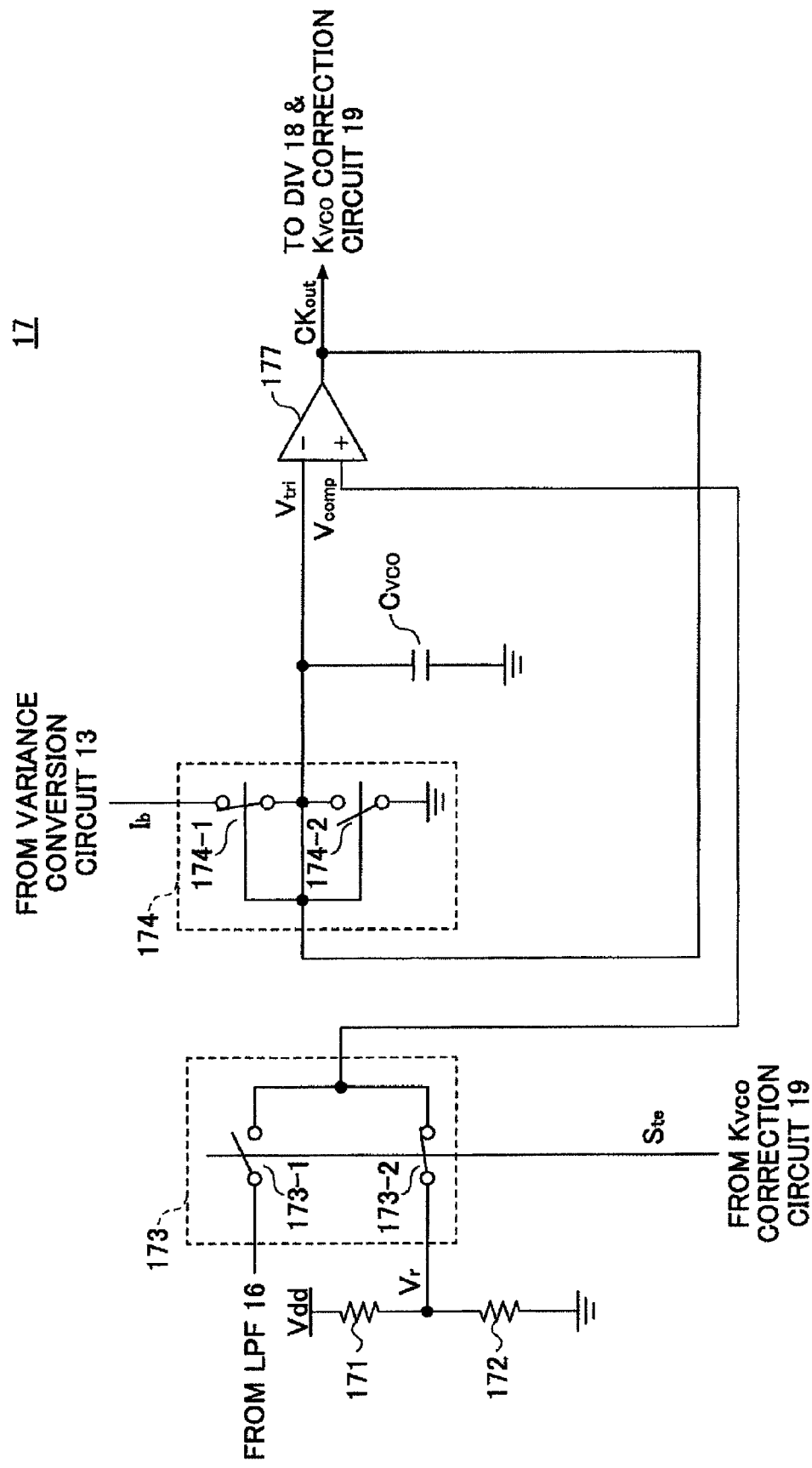
FIG. 18 is a circuit diagram illustrating a structure of a voltage controlled oscillator in the second embodiment.

FIG. 18 is a circuit diagram illustrating a structure of a VCO 17 in the second embodiment. In FIG. 18, those parts that are the same as those corresponding parts in FIG. 11 are designated by the same reference numerals, and a description thereof will be omitted. In FIG. 18, a part made up of the capacitors 175-1 through 175-M and the switches 176-1 through 176-M is replaced by a capacitor part $C_{VCO}$ having a fixed capacitance $C_{VCO}$.

According to this embodiment, at the time of the tuning of the PLL circuit 11, the first circuit part of the variance conversion circuit 13 converts the variance in the output current Ib of the variance conversion circuit 13 into the variance in the resistance Rr of the resistor Rr within the variance conversion circuit 13, so that the output current Ib, the resistance Rr and the reference voltage Vr satisfy the relationship Rr=Vr/Ib. Consequently, the output current Ib which is obtained by varying the mirror ratio of the current mirror circuit is supplied to the CP 15 and the VCO 17. The resistance Rr is equal to the resistance $R_{LPF}$ of the resistor part $R_{LPF}$ within the LPF 16. In addition, when the conversion into the variance in the resistance Rr of the resistor part Rr by the variance conversion circuit 13 ends, the first circuit part of the variance conversion circuit 13 supplies the enable signal EN to the VCO 17 and the $K_{VCO}$ correction circuit 19. In this case, the $K_{VCO}$ correction circuit 19 supplies to the LPF 16 and the variance conversion circuit 13 a control signal Sc which controls the resistance of the resistor part formed by the resistors 261-1 through 261-L within the LPF 16 and the output current Ib from the current adjusting part within the second circuit part of the variance conversion circuit 13. In this embodiment, the control signal Sc output from the $K_{VCO}$ correction circuit 19 is not supplied to the VCO 17.

According to this embodiment, when the resistance Rr within the variance conversion circuit 13 (that is, the resistance $R_{LPF}$ within the LPF 16) varies greatly, the current I0 from the current source 12 is once converted into a smaller current Ib by the variance conversion circuit 13. In this case, by controlling the output current Ib of the current adjusting part within the variance conversion circuit 13 to become larger by the $K_{VCO}$ correction circuit 19, the parameter ω1 described above is corrected. In addition, by controlling the resistance $R_{LPF}$ of the resistor part $R_{LPF}$ within the LPF 16 to become smaller by the $K_{VCO}$ correction circuit 19, a product of the resistance $R_{LPF}$ and the capacitance $C_{LPF}$ within the LPF 16 is controlled, and the parameters ω2 and ω3 described above are corrected.

In other words, because the output current $I_{CP}$ of the CP 15 and the capacitance $C_{LPF}$ of the capacitor part $C_{LPF}$ within the LPF 16 are linked to the output current Ib of the variance conversion circuit 13 and the capacitance $C_{VCO}$ of the capacitor part $C_{VCO}$ within the VCO 17, $Ib/(C_{VCO} \cdot V_{comp})$ and $Ib/(C_{all} \cdot V_{comp})$ become proportional to the oscillation frequency $f_{VCO}$ of the VCO 17 if the output current $I_{CP}$ of the CP 15 is set to an arbitrary multiple of the output current Ib of the variance conversion circuit 13. Hence, the parameter ω1 described above is corrected so as to satisfy a relationship $ω1 = \{1/(2π \cdot N_{div})\}^{1/2} \cdot \{2π \cdot Ib/(C_{VCO} \cdot V_{comp})\}^{1/2} \cdot \{I_{CP}/C_{all}\}^{1/2} = (1/N_{div})^{1/2} \cdot \{Ib/(C_{VCO} \cdot V_{comp})\}^{1/2} \cdot \{I_{CP}/(C_{all} \cdot V_{comp})\}^{1/2} = (1/N_{div})^{1/2} \cdot α \cdot f_{VCO}$, where α is an arbitrary constant. In addition, the parameters ω2 and ω3 are corrected so as to satisfy a relationship $ω2 = 1/(R_{LPF} \cdot C_{LPF}) = Ib/(Vr \cdot C_{LPF})$.

Figure 19A:
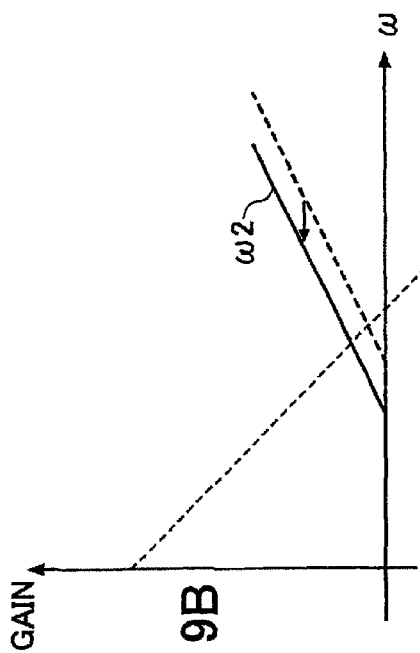
FIGS. 19A, 19B, 19C and 19D are diagrams illustrating a manner in which the variance in resistance is corrected.
Figure 19B:
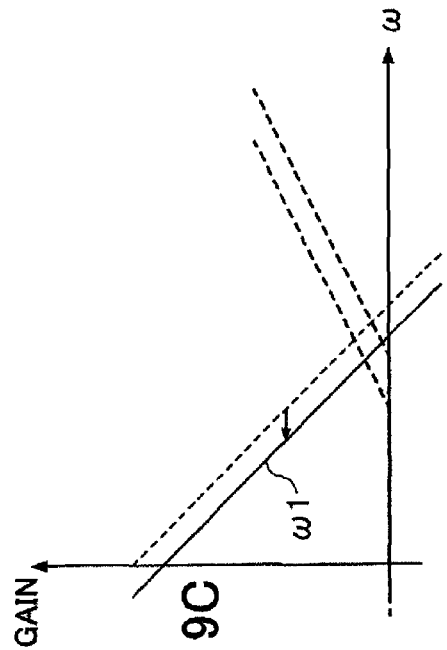
Figure 19D:
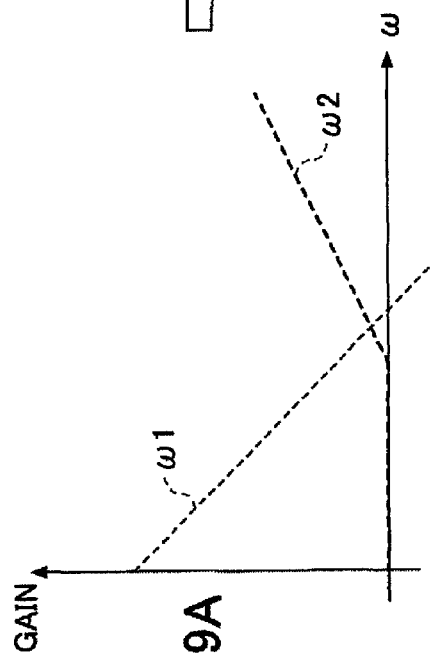
Figure 19C:
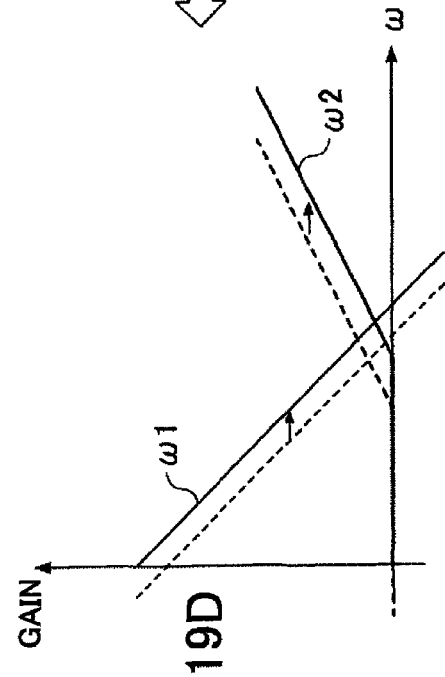

FIGS. 19A, 19B, 19C and 19D are diagrams illustrating a manner in which the variance in resistance Rr (that is, the resistance $R_{LPF}$) is corrected, and illustrate a gain versus frequency characteristic of the PLL circuit 11. In FIG. 19A through 19D, the ordinate and the abscissa are indicated in arbitrary logarithmic units. FIG. 19A illustrates the designed values of the parameters ω1 and ω2. For the sake of convenience, the illustration of the parameter ω3 is omitted. FIG. 19B illustrates a case where the resistance Re is greater than the designed value, and the parameter ω2 is shifted towards the left from the designed value. FIG. 19C illustrates a state where the output current Ib has become smaller by the tuning performed by the first circuit part of the variance conversion circuit 13. In addition, FIG. 19D illustrates a state where the capacitances $C_{LPF}$ and CP within the LFP 15 and the capacitance $C_{VCO}$ within the VCO 17 are corrected by the tuning performed by the second circuit part of the variance conversion circuit 13, to thereby correct the parameter ω1, and the parameter ω2 is also corrected by linking to the correction of the parameter ω1.

Third Embodiment

Next, a description will be given of a third embodiment.

Figure 20:
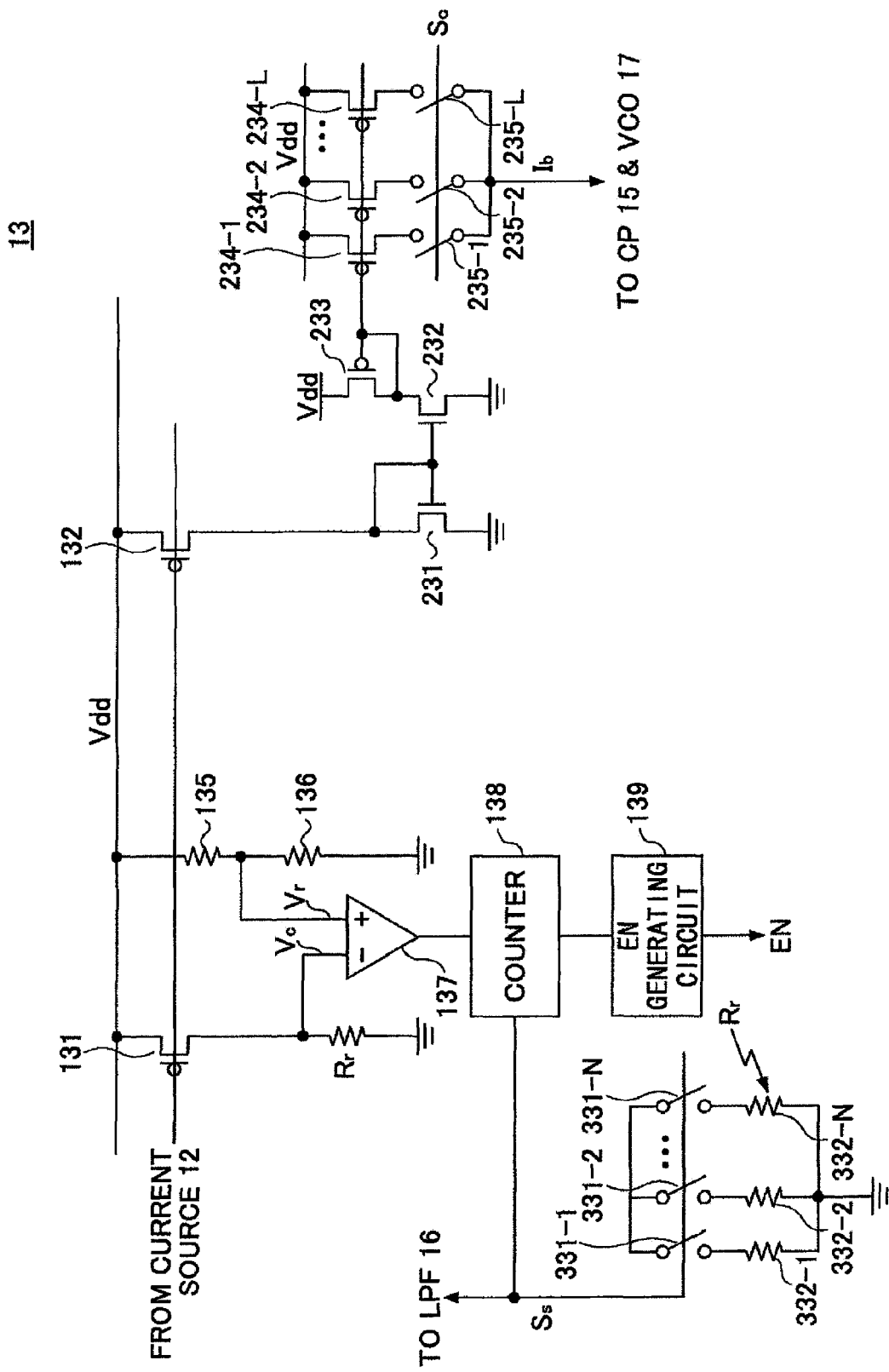
FIG. 20 is a circuit diagram illustrating a structure of a variance conversion circuit in a third embodiment.

FIG. 20 is a circuit diagram illustrating a structure of a variance conversion circuit 13 in the third embodiment. In FIG. 20, those parts that are the same as those corresponding parts in FIG. 16 are designated by the same reference numerals, and a description thereof will be omitted. A first circuit part of the variance conversion circuit 13 includes P-channel MOS transistors 131 and 132, resistors 135 and 136, switches 331-1 through 331-N (N is a natural number greater than or equal to 2), resistors 332-1 through 332-N, a comparator 137, a counter 138, and an enable signal (EN) generating circuit 139 which are coupled as illustrated in FIG. 20. The switches 331-1 through 331-N and the resistors 332-1 through 332-N form the resistor part Rr, and the ON and OFF states of the switches 331-1 through 331-N are controlled by an output of the counter 138. The output of the counter is an N-bit control signal Ss indicating a counted value $D_{isw}$. The resistance Rr of the resistor part Rr changes inversely proportionally to the number of switches 332-1 through 332-N that are turned ON.

Figure 21:
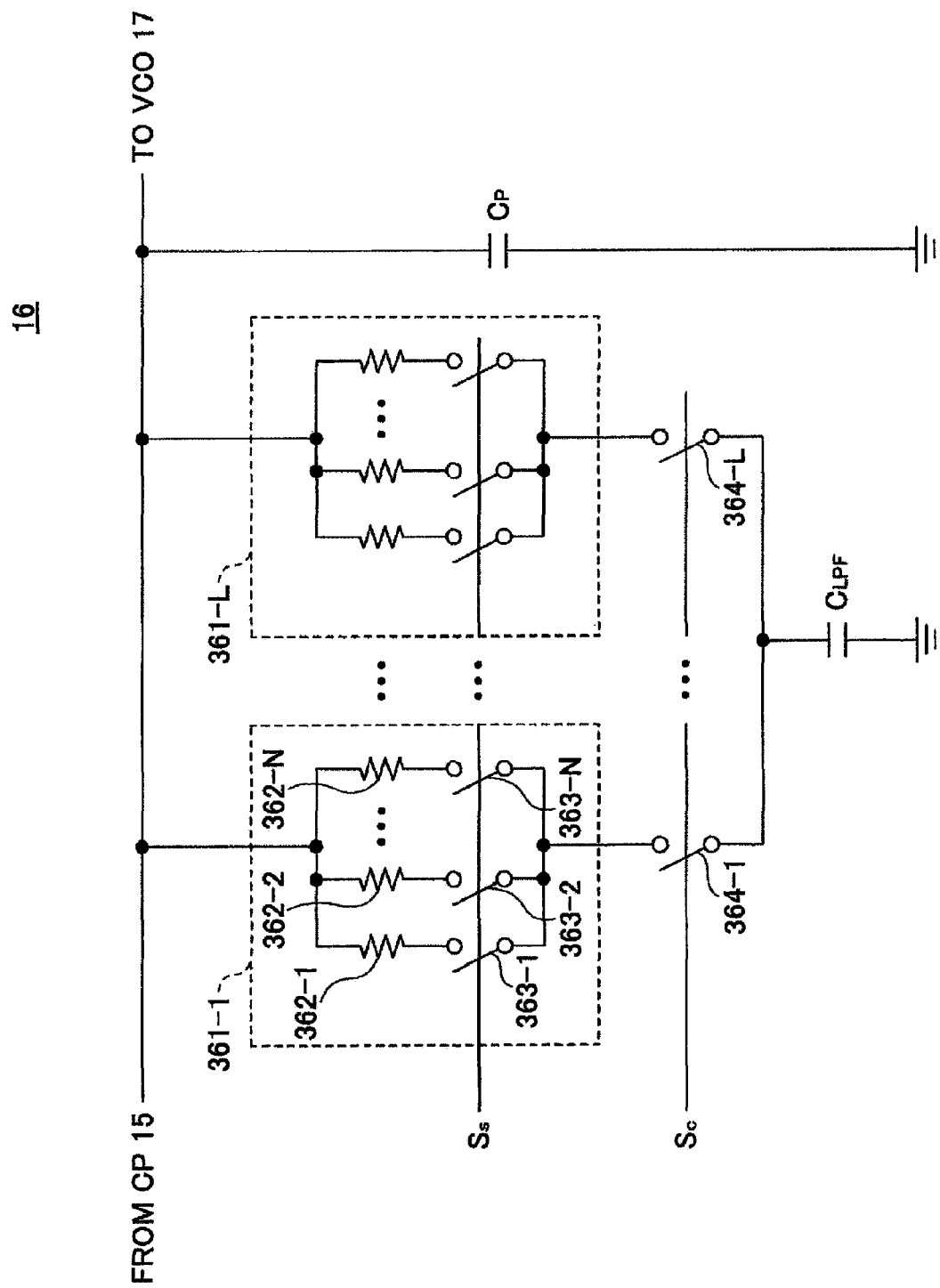
FIG. 21 is a circuit diagram illustrating a structure of a lowpass filter in the third embodiment.

FIG. 21 is a circuit diagram illustrating a structure of a LPF 16 in the third embodiment. In FIG. 21, those parts that are the same as those corresponding parts in FIG. 10 are designated by the same reference numerals, and a description thereof will be omitted. In addition to the capacitor parts $C_{LPF}$ and $C_P$, the LPF 16 further includes resistor groups 361-1 through 361-L (L is a natural number greater than or equal to 2) and switches 364-1 through 364-L which are coupled as illustrated in FIG. 21. Each of the resistor groups 361-1 through 361-L has the same structure, and is formed by resistors 362-1 through 362-N having the same resistance and switches 363-1 through 363-N. The resistor part $R_{LPF}$ is formed by the resistor groups 361-1 through 361-L and the switches 364-1 through 364-L which are coupled as illustrated in FIG. 21. The ON and OFF states of the switches 364-1 through 364-L are controlled by an L-bit control signal Sc from the $K_{VCO}$ correction circuit 19. In addition, the ON and OFF states of the switches 363-1 through 363-N within each of the resistor groups 361-1 through 361-L are controlled by a control signal Ss which is output from the counter 138 within the variance conversion circuit 13. Accordingly, corresponding switches, one selected from the switches 363-1 through 363-N within the variance conversion circuit 13 and the other selected from the switches 363-1 through 363-N within each of the resistor groups 361-1 through 361-L within the LPF 16, are turned ON or OFF in a similar manner. For example, the resistances of the resistors 362-1 through 362-N are the same as the resistances of the resistors 332-1 through 332-N within the variance conversion circuit 13. In each of the resistor groups 361-1 through 361-L, the resistance of the resistor group changes inversely proportionally to the number of switches 363-1 through 363-N that are turned ON. In addition, the resistance $R_{LPF}$ of the resistor part $R_{LPF}$ changes inversely proportionally to the number of switches 364-1 through 364-L that are turned ON.

The structure of the VCO 17 of the third embodiment is the same as that illustrated in FIG. 18.

According to this embodiment, at the time of the tuning of the PLL circuit 11, the first circuit part of the variance conversion circuit 13 converts the variance in the output current Ib of the variance conversion circuit 13 into the variance in the resistance Rr of the resistor Rr within the variance conversion circuit 13, so that the output current Ib, the resistance Rr and the reference voltage Vr satisfy the relationship Rr=Vr/Ib. Consequently, the output current Ib which is obtained by varying the mirror ratio of the current mirror circuit is supplied to the CP 15 and the VCO 17. The resistance Rr is equal to the resistance $R_{LPF}$ of the resistor part $R_{LPF}$ within the LPF 16. In addition, the resistance Rr of the resistor part Rr within the variance conversion circuit 13 is adjusted by controlling the ON and OFF states of the switches 331-1 through 331-N which select the resistors 332-1 through 332-N by the control signal Ss. The resistance $R_{LPF}$ of the resistor part $R_{LPF}$ within the LPF 16 is adjusted by controlling the ON and OFF states of the switches 363-1 through 363-N which select the resistors 362-1 through 362-N within each of the resistor groups 361-1 through 361-L by the control signal Ss, and is also adjusted by controlling the ON and OFF states of the switches 364-1 through 364-L by the control signal Sc. Furthermore, when the conversion into the variance in the resistance Rr by the variance conversion circuit 13 ends, the first circuit part of the variance conversion circuit 13 supplies the enable signal EN to the VCO 17 and the $K_{VCO}$ correction circuit 19. In this case, the $K_{VCO}$ correction circuit 19 supplies to the LPF 16 and the variance conversion circuit 13 a control signal Sc which controls the resistance of the resistor part formed by the resistor groups 361-1 through 361-L within the LPF 16 and the output current Ib from the current adjusting part within the second circuit part of the variance conversion circuit 13. In this embodiment, the control signal Sc output from the $K_{VCO}$ correction circuit 19 is not supplied to the VCO 17.

According to this embodiment, when the resistance Rr within the variance conversion circuit 13 (that is, the resistance $R_{LPF}$ within the LPF 16) varies greatly, the resistance Rr within the variance conversion circuit 13 is once converted into a smaller value by the variance conversion circuit 13. In this case, by controlling the output current Ib of the current adjusting part within the variance conversion circuit 13 to become larger by the $K_{VCO}$ correction circuit 19, the parameter ω1 described above is corrected. In addition, by controlling the resistance $R_{LPF}$ of the resistor part $R_{LPF}$ within the LPF 16 to become smaller by the $K_{VCO}$ correction circuit 19, a product of the resistance $R_{LPF}$ and the capacitance $C_{LPF}$ within the LPF 16 is controlled, and the parameters ω2 and ω3 described above are corrected.

In other words, because the output current $I_{CP}$ of the CP 15 and the capacitance $C_{LPF}$ of the capacitor part $C_{LPF}$ within the LPF 16 are linked to the output current Ib of the variance conversion circuit 13 and the capacitance $C_{VCO}$ of the capacitor part $C_{VCO}$ within the VCO 17, Ib/($C_{VCO}\cdot V_{comp}$) and Ib/($C_{all}/V_{comp}$) become proportional to the oscillation frequency $f_{VCO}$ of the VCO 17 if the output current $I_{CP}$ of the CP 15 is set to an arbitrary multiple of the output current Ib of the variance conversion circuit 13. Hence, the parameter ω1 described above is corrected so as to satisfy a relationship ω1= $\{1/(2\pi\cdot N_{div})\}^{1/2}\cdot\{2\pi\cdot Ib/(C_{VCO}\cdot V_{comp})\}^{1/2}\cdot\{I_{CP}/C_{all}\}^{1/2}$= $(1/N_{div})^{1/2}\cdot\{Ib/(C_{VCO}\cdot V_{comp})\}^{1/2}\cdot\{I_{CP}/(C_{all}\cdot V_{comp})\}^{1/2}$= $(1/N_{div})^{1/2}\cdot\alpha\cdot f_{VCO}$, where α is an arbitrary constant. In addition, the parameters ω2 and ω3 are corrected so as to satisfy a relationship ω2=1/($R_{LPF}\cdot C_{LPF}$)=Ib/(Vr·$C_{LPF}$).

FIGS. 22A, 22B, 22C and 22B are diagrams illustrating a manner in which the variance in the capacitances $C_{LPF}$ and $C_P$ is corrected, and illustrate a gain versus frequency characteristic of the PLL circuit 11. In FIG. 22A through 22D, the ordinate and the abscissa are indicated in arbitrary logarithmic units. FIG. 22A illustrates the designed values of the parameters ω1 and ω2. For the sake of convenience, the illustration of the parameter ω3 is omitted. FIG. 22B illustrates a case where the capacitances $C_{LPF}$ and $C_P$ are greater than the designed values, and the parameters ω1 and ω2 are shifted towards the right from the designed values. FIG. 22C illustrates a state where the output current Ib has become smaller by the tuning performed by the first circuit part of the variance conversion circuit 13, but does not contribute to the correction of the capacitances $C_{LPF}$ and $C_P$. In addition, FIG. 22D illustrates a state where the capacitances $C_{LPF}$ and $C_P$ within the LFP 15 and the capacitance $C_{VCO}$ within the VCO 17 are corrected by the tuning performed by the second circuit part of the variance conversion circuit 13, to thereby correct the parameter ω1, and the parameter ω2 is also corrected by linking to the correction of the parameter ω1.

Fourth Embodiment

Next, a description will be given of a fourth embodiment.

The structure of a variance conversion circuit 13 in the fourth embodiment is the same as that illustrated in FIG. 20. In addition, the structure of a VCO 17 of the fourth embodiment is the same as that illustrated in FIG. 11. However, M=L in this case. A control signal Sc that is output from a $K_{VCO}$ correction circuit 19 is supplied to the variance conversion circuit 13, a LPF 16 and the VCO 17. In addition, a control signal Ss that is output from the variance conversion circuit 13 is supplied to the LPF 16.

FIG. 23 is a circuit diagram illustrating a structure of the LPF 16 in the fourth embodiment. In FIG. 23, those parts that are the same as those corresponding parts in FIG. 10 are designated by the same reference numerals, and a description thereof will be omitted. The resistor part $R_{LPF}$ is formed by resistors 461-1 through 461-N having the same resistance, and switches 462-1 through 462-N which are coupled as illustrated in FIG. 23. The resistances of the resistors 461-1 through 461-N are the same as the resistances of the resistors 332-1 through 332-N within the variance conversion circuit 13. The ON and OFF states of the switches 462-1 through 462-N are controlled by a control signal Ss which is output from the counter 138 within the variance conversion circuit 13. Accordingly, corresponding switches, one selected from the switches 333-1 through 333-N within the variance conversion circuit 13 and the other selected from the switches 462-1 through 462-N within the LPF 16, are turned ON or OFF in a similar manner.

The capacitor part $C_{LPF}$ is formed by capacitors 463-1 through 463-L having the same capacitance, and switches 464-1 through 464-L which are coupled as illustrated in FIG. 23. The capacitor part $C_P$ is formed by capacitors 465-1 through 465-L having the same capacitance, and switches 466-1 through 466-L which are coupled as illustrated in FIG. 23. The capacitances of the capacitors 463-1 through 463-L and the capacitors 465-1 through 465-L are the same as the capacitances of the capacitors 175-1 through 175-M (M=L) within the VCO 17 illustrated in FIG. 11. In addition, the ON and OFF states of the switches 464-1 through 464-L and the switches 466-1 through 466-L are controlled by a control signal Sc which is output from the $K_{VCO}$ correction circuit 19, similarly to the switches 176-1 through 176-M (M=L) within the VCO 17.

According to this embodiment, at the time of the tuning of the PLL circuit 11, the first circuit part of the variance conversion circuit 13 converts the variance in the output current Ib of the variance conversion circuit 13 into the variance in the resistance Rr of the resistor Rr within the variance conversion circuit 13, so that the output current Ib, the resistance Rr and the reference voltage Vr satisfy the relationship Rr=Vr/Ib. Consequently, the output current Ib which is obtained by varying the mirror ratio of the current mirror circuit is supplied to the CP 15 and the VCO 17. The resistance Rr is equal to the resistance $R_{LPF}$ of the resistor part $R_{LPF}$ within the LPF 16. In addition, the resistance Rr of the resistor part Rr within the variance conversion circuit 13 is adjusted by controlling the ON and OFF states of the switches 331-1 through 331-N which select the resistors 332-1 through 332-N by the control signal Ss. The resistance $R_{LPF}$ of the resistor part $R_{LPF}$ within the LPF 16 is adjusted by controlling the ON and OFF states of the switches 462-1 through 462-N which select the resistors 461-1 through 461-N by the control signal Ss. Furthermore, when the conversion into the variance in the resistance Rr by the variance conversion circuit 13 ends, the first circuit part of the variance conversion circuit 13 supplies the enable signal EN to the VCO 17 and the $K_{VCO}$ correction circuit 19. In this case, the $K_{VCO}$ correction circuit 19 supplies to the LPF 16, the variance conversion circuit 13 and the VCO 17 a control signal Sc which controls the capacitances $C_{LPF}$ and $C_P$ within the capacitor parts $C_{LPF}$ and $C_P$ within the LPF 16, the output current Ib from the current adjusting part within the second circuit part of the variance conversion circuit 13, and the capacitance $C_{VCO}$ of the capacitor part $C_{VCO}$ within the VCO 17.

According to this embodiment, when the resistance Rr within the variance conversion circuit 13 (that is, the resistance $R_{LPF}$ within the LPF 16) varies greatly, the resistance Rr within the variance conversion circuit 13 is once converted into a smaller value by the variance conversion circuit 13. In this case, by controlling the output current Ib of the current adjusting part within the variance conversion circuit 13 to become larger by the $K_{VCO}$ correction circuit 19, the parameter $\omega 1$ described above is corrected. In addition, by controlling the resistance $R_{LPF}$ of the resistor part $R_{LPF}$ within the LPF 16 to become smaller by the $K_{VCO}$ correction circuit 19, a product of the resistance $R_{LPF}$ and the capacitance $C_{LPF}$ within the LPF 16 is controlled, and the parameters $\omega 2$ and $\omega 3$ described above are corrected.

In other words, because the output current $I_{CP}$ of the CP 15 and the capacitance $C_{LPF}$ of the capacitor part $C_{LPF}$ within the LPF 16 are linked to the output current Ib of the variance conversion circuit 13 and the capacitance $C_{VCO}$ of the capacitor part $C_{VCO}$ within the VCO 17, $Ib/(C_{VCO} \cdot V_{comp})$ and $Ib/(C_{all} \cdot V_{comp})$ become proportional to the oscillation frequency $f_{VCO}$ of the VCO 17 if the output current $I_{CP}$ of the CP 15 is set to an arbitrary multiple of the output current Ib of the variance conversion circuit 13. Hence, the parameter $\omega 1$ described above is corrected so as to satisfy a relationship $\omega 1 = \{1/(2\pi \cdot N_{div})\}^{1/2} \cdot \{2\pi \cdot Ib/(C_{VCO} \cdot V_{comp})\}^{1/2} \cdot \{I_{CP}/C_{all}\}^{1/2} = (1/N_{div})^{1/2} \cdot \{Ib/(C_{VCO} \cdot V_{comp})\}^{1/2} \cdot \{I_{CP}/(C_{all} \cdot V_{comp})\}^{1/2} = (1/N_{div})^{1/2} \cdot \alpha \cdot f_{VCO}$, where $\alpha$ is an arbitrary constant. In addition, the parameters $\omega 2$ and $\omega 3$ are corrected so as to satisfy a relationship $\omega 2 = 1/(R_{LPF} \cdot C_{LPF}) = Ib/(Vr \cdot C_{LPF})$.

FIGS. 24A, 24B, 24C and 24D are diagrams illustrating a manner in which the variance in current value of the current Ib is corrected, and illustrate a gain versus frequency characteristic of the PLL circuit 11. In FIG. 24A through 24D, the ordinate and the abscissa are indicated in arbitrary logarithmic units. FIG. 24A illustrates the designed values of the parameters $\omega 1$ and $\omega 2$. For the sake of convenience, the illustration of the parameter $\omega 3$ is omitted. FIG. 24B illustrates a case where the current value of the current Ib is larger than the designed value, and the parameter $\omega 1$ is shifted towards the right from the designed value. FIG. 24C illustrates a state where the output current Ib has become smaller by the tuning performed by the first circuit part of the variance conversion circuit 13. In addition, FIG. 24D illustrates a state where the capacitances $C_{LPF}$ and $C_P$ within the LPF 15 and the capacitance $C_{VCO}$ within the VCO 17 are corrected by the tuning performed by the second circuit part of the variance conversion circuit 13, to thereby correct the parameter $\omega 1$, and the parameter $\omega 2$ is also corrected by linking to the correction of the parameter $\omega 1$. The corrected parameter $\omega 1$ illustrated in FIG. 24D remains unchanged from the corrected parameter $\omega 1$ illustrated in FIG. 24C.

In each of the embodiments described above, the tuning that is performed prior to the normal operation of the PLL circuit 11 is performed every time the power of the PLL circuit 11 is turned ON, for example. By performing the tuning every time before the normal operation of the PLL circuit 11 is performed, it is possible to correct the variance in the characteristics of the PLL circuit 11 by also taking into consideration the changes in the characteristics of the elements forming each part of the PLL circuit 11 caused by aging.

Of course, the number of PLL circuits within the semiconductor integrated circuit is not limited to one, and a plurality of PLL circuits may be provided within the semiconductor integrated circuit. As a modification of each of the embodiments described above, if a plurality of identical PLL circuits are provided within the semiconductor integrated circuit, the parameters $\omega 1$, $\omega 2$ and $\omega 3$ obtained for one PLL circuit may be stored in a storage part within the semiconductor integrated circuit, and the stored parameters $\omega 1$, $\omega 2$ and $\omega 3$ may be used with respect to the other PLL circuits within the semiconductor integrated circuit because the variance in the characteristics of each of the PLL circuits will be approximately the same.

The embodiments are applicable to PLL circuits in which the variance in the characteristics of the PLL is generated due to inconsistencies introduced during the fabrication process.

All examples and conditional language recited herein are intended for pedagogical purposes to aid the reader in understanding the invention and the concepts contribute by the inventor to furthering the art, and are to be construed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention. Numbers applying embodiments (first, second or third etc.) do not show priorities of the embodiments. Many variations and modifications will be apparent to those skilled in the art.

What is claimed is:

1. A variance correction method for correcting a variance in characteristics of a PLL circuit, the variance correction method comprising:
generating a reference current depending on a resistance within a lowpass filter and outputting the reference current to a voltage controlled oscillator; and
correcting characteristics of the lowpass filter and a gain of the voltage controlled oscillator based on an output clock of the voltage controlled oscillator.

2. The variance correction method as claimed in claim 1, wherein the variance is corrected by varying a mirror ratio of a current mirror circuit depending on a variance of an output current of a current source from a designed value in the generating a reference current.

3. The variance correction method as claimed in claim 1, wherein a capacitance within the lowpass filter and a capacitance within the voltage controlled oscillator are adjusted depending on a control signal that is generated based on the input clock to the PLL circuit, the output clock and a multiplication factor of a frequency divider are adjusted to correct the characteristics of the lowpass filter and the gain of the voltage controlled oscillator.

4. The variance correction method as claimed in claim 3, wherein:
the capacitance within the lowpass filter is adjusted by selecting first capacitors coupled in parallel within the lowpass filter by the control signal which controls ON and OFF states of first switches coupled in series to each of the first capacitors; and
the capacitance within the voltage controlled oscillator is adjusted by selecting second capacitors coupled in parallel within the voltage controlled oscillator by the control signal which controls ON and OFF states of second switches coupled in series to each of the second capacitors.

5. The variance correction method as claimed in claim 2, wherein:
the reference current is adjusted by varying the mirror ratio of the current mirror circuit depending on a control signal that is generated based on the input clock to the PLL circuit, the output clock and a multiplication factor of the frequency divider; and
the characteristics of the lowpass filter is adjusted by selecting resistors coupled in parallel within the lowpass filter by controlling ON and OFF states of switches coupled in series to each of the resistors by the control signal.

6. The variance correction method as claimed in claim 1, wherein the generating a reference current and the correcting characteristics of the lowpass filter and a gain of the voltage controlled oscillator are performed prior to a normal operation of the PLL circuit.

7. A PLL circuit comprising:
a series coupling of a phase frequency detector, a charge pump, a lowpass filter and a voltage controlled oscillator, the voltage controlled oscillator feeding back an output clock thereof to the phase frequency detector which receives an input clock via a frequency divider;
a variance conversion circuit configured to generate a reference current depending on a resistance within the lowpass filter and to output the reference current to the charge pump and the voltage controlled oscillator; and
a gain correction circuit configured to generate a control signal for correcting characteristics of the lowpass filter and a gain of the voltage controlled oscillator based on the output clock of the voltage controlled oscillator.

8. The PLL circuit as claimed in claim 7, wherein the variance conversion circuit includes a current mirror circuit configured to correct the variance by varying a mirror ratio thereof depending on a variance of an output current of a current source from a designed value.

9. The PLL circuit as claimed in claim 7, wherein the gain correction circuit generates the control signal for adjusting a capacitance within the lowpass filter and a capacitance within the voltage controlled oscillator based on the input clock to the PLL circuit, the output clock and a multiplication factor of the frequency divider.

10. The PLL circuit as claimed in claim 7, wherein:
the lowpass filter includes first capacitors coupled in parallel and first switches coupled in series to each of the first capacitors, the first capacitors being selected by the control signal which controls ON and OFF states of first switches; and
the voltage controlled oscillator includes second capacitor coupled in parallel and second switches coupled in series to each of the second capacitors, the second capacitors being selected by the control signal which controls ON and OFF states of the second switches.

11. The PLL circuit as claimed in claim 8, wherein:
the reference current is adjusted by varying the mirror ratio of the current mirror circuit depending on the control signal that is generated based on the input clock to the PLL circuit, the output clock and a multiplication factor of the frequency divider;
the lowpass filter includes resistors coupled in parallel and switches coupled in series to each of the resistors; and
the characteristics of the lowpass filter is adjusted by selecting the resistors by controlling ON and OFF states of the switches by the control signal.

12. The PLL circuit as claimed in claim 7, wherein the characteristics of the lowpass filter and the gain of the voltage controlled oscillator are adjusted prior to a normal operation of the PLL circuit.

13. The PLL circuit as claimed in claim 7, wherein the voltage controlled oscillator includes one of a multivibrator type voltage controlled oscillator and a relaxation oscillator.

14. A semiconductor integrated circuit comprising:
at least one PLL circuit;
the PLL circuit comprising:
a series coupling of a phase frequency detector, a charge pump, a lowpass filter and a voltage controlled oscillator, the voltage controlled oscillator feeding back an output clock thereof to the phase frequency detector which receives an input clock via a frequency divider;
a variance conversion circuit configured to generate a reference current depending on a resistance within the lowpass filter and to output the reference current to the charge pump and the voltage controlled oscillator; and
a gain correction circuit configured to generate a control signal for correcting characteristics of the lowpass filter and a gain of the voltage controlled oscillator based on the output clock of the voltage controlled oscillator.

* * * * *